United States Patent
Yoneda et al.

(10) Patent No.: US 8,873,308 B2
(45) Date of Patent: Oct. 28, 2014

(54) SIGNAL PROCESSING CIRCUIT

(71) Applicant: Semiconductor Energy Laboratory Co., Ltd., Atsugi (JP)

(72) Inventors: Seiichi Yoneda, Kanagawa (JP); Atsuo Isobe, Kanagawa (JP); Yuji Iwaki, Kanagawa (JP); Koichiro Kamata, Kanagawa (JP); Yasuyuki Takahashi, Miyagi (JP); Masumi Nomura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/923,696

(22) Filed: Jun. 21, 2013

(65) Prior Publication Data

US 2014/0003146 A1 Jan. 2, 2014

(30) Foreign Application Priority Data

Jun. 29, 2012 (JP) .................................. 2012-147187

(51) Int. Cl.

| | |
|---|---|
| G11C 14/00 | (2006.01) |
| G11C 29/00 | (2006.01) |
| G11C 5/06 | (2006.01) |
| G11C 5/14 | (2006.01) |
| G11C 16/30 | (2006.01) |
| G06F 1/32 | (2006.01) |
| G11C 7/10 | (2006.01) |
| G11C 7/20 | (2006.01) |

(52) U.S. Cl.
CPC ........ *G11C 16/30* (2013.01); *G11C 2207/2227* (2013.01); *G11C 7/1087* (2013.01); *G11C 7/106* (2013.01); *G11C 7/20* (2013.01); *G06F 1/3203* (2013.01); *G06F 1/3275* (2013.01)

USPC ............ 365/189.05; 365/189.07; 365/185.22; 365/229

(58) Field of Classification Search
CPC .. G11C 2207/2227; G11C 7/20; G11C 7/106; G11C 7/1087
USPC .................... 365/185.22, 189.05, 189.07, 229
See application file for complete search history.

(56) References Cited

U.S. PATENT DOCUMENTS

| | | |
|---|---|---|
| 4,656,607 A | 4/1987 | Hagiwara et al. |
| 4,797,576 A | 1/1989 | Asazawa |

(Continued)

FOREIGN PATENT DOCUMENTS

| | | |
|---|---|---|
| EP | 0 135 036 A2 | 3/1985 |
| EP | 0 297 777 A2 | 1/1989 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Ly D Pham
(74) *Attorney, Agent, or Firm* — Fish & Richardson P.C.

(57) ABSTRACT

A signal processing circuit that consumes less power by stop of supply of power for a short time. In a storage element, before supply of power is stopped, data in a first storage circuit is stored to a second storage circuit, and the data is read from the second storage circuit and a verification circuit can determine whether or not the data in the second storage circuit matches the data in the first storage circuit. After supply of power is restarted, the data in the second storage circuit is stored to the first storage circuit, and the verification circuit can determine whether or not the data in the second storage circuit matches the data in the first storage circuit. In such a manner, verification can be performed without requiring a time for verification.

5 Claims, 13 Drawing Sheets

(56) References Cited

U.S. PATENT DOCUMENTS

| | | |
|---|---|---|
| 4,809,225 A | 2/1989 | Dimmler et al. |
| 5,218,607 A | 6/1993 | Saito et al. |
| 5,731,856 A | 3/1998 | Kim et al. |
| 5,744,864 A | 4/1998 | Cillessen et al. |
| 5,936,879 A | 8/1999 | Brouwer et al. |
| 6,046,606 A | 4/2000 | Chu et al. |
| 6,127,702 A | 10/2000 | Yamazaki et al. |
| 6,294,274 B1 | 9/2001 | Kawazoe et al. |
| 6,385,120 B1 | 5/2002 | Steiss |
| 6,563,174 B2 | 5/2003 | Kawasaki et al. |
| 6,576,943 B1 | 6/2003 | Ishii et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,809,952 B2 | 10/2004 | Masui |
| 6,845,032 B2 | 1/2005 | Toyoda et al. |
| 6,876,023 B2 | 4/2005 | Ishii et al. |
| 6,934,178 B2 | 8/2005 | Yokozeki et al. |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,612,594 B2 | 11/2009 | Fukuoka |
| 7,616,040 B2 | 11/2009 | Motomura |
| 7,674,650 B2 | 3/2010 | Akimoto et al. |
| 7,732,819 B2 | 6/2010 | Akimoto et al. |
| 7,847,287 B2 | 12/2010 | Kim et al. |
| 7,863,611 B2 | 1/2011 | Abe et al. |
| 7,863,627 B2 | 1/2011 | Honda |
| 7,910,490 B2 | 3/2011 | Akimoto et al. |
| 7,932,521 B2 | 4/2011 | Akimoto et al. |
| 7,940,085 B2 | 5/2011 | Kim et al. |
| 8,085,076 B2 | 12/2011 | Djaja et al. |
| 8,115,201 B2 | 2/2012 | Yamazaki et al. |
| 8,158,987 B2 | 4/2012 | Nabekura et al. |
| 8,217,680 B2 | 7/2012 | Kim et al. |
| 8,274,077 B2 | 9/2012 | Akimoto et al. |
| 8,362,478 B2 | 1/2013 | Yamazaki et al. |
| 8,422,298 B2 | 4/2013 | Saito et al. |
| 8,441,868 B2 | 5/2013 | Saito |
| 2001/0046027 A1 | 11/2001 | Tai et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyada et al. |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0223275 A1 | 9/2007 | Nakajima et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0002590 A1 | 1/2009 | Kimura |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0019839 A1 | 1/2010 | Monden |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0193785 A1 | 8/2010 | Kimura |

(56) References Cited

U.S. PATENT DOCUMENTS

| | | |
|---|---|---|
| 2010/0200851 A1 | 8/2010 | Oikawa et al. |
| 2010/0252832 A1 | 10/2010 | Asano et al. |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0101351 A1 | 5/2011 | Yamazaki |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0163311 A1 | 7/2011 | Akimoto et al. |
| 2011/0176357 A1 | 7/2011 | Koyama et al. |
| 2011/0187410 A1 | 8/2011 | Kato et al. |
| 2012/0033505 A1 | 2/2012 | Sekine et al. |
| 2012/0051117 A1 | 3/2012 | Yamazaki et al. |
| 2012/0132910 A1 | 5/2012 | Yamazaki et al. |
| 2012/0170355 A1 | 7/2012 | Ohmaru et al. |
| 2012/0230114 A1 | 9/2012 | Sekine |
| 2012/0275245 A1 | 11/2012 | Sekine et al. |
| 2013/0057315 A1 | 3/2013 | Kato et al. |

FOREIGN PATENT DOCUMENTS

| | | |
|---|---|---|
| EP | 0 404 061 A2 | 12/1990 |
| EP | 0 530 928 A2 | 3/1993 |
| EP | 0 818 891 A2 | 1/1998 |
| EP | 0 936 546 A2 | 8/1999 |
| EP | 1 447 909 A1 | 8/2004 |
| EP | 1 583 239 A2 | 10/2005 |
| EP | 1 737 044 A1 | 12/2006 |
| EP | 1 770 788 A2 | 4/2007 |
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 226 847 A2 | 9/2010 |
| JP | 58-205226 A | 11/1983 |
| JP | 60-025269 A | 2/1985 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-027419 A | 2/1991 |
| JP | 03-192915 A | 8/1991 |
| JP | 05-110392 A | 4/1993 |
| JP | 05-251705 A | 9/1993 |
| JP | 07-141074 A | 6/1995 |
| JP | 07-147530 A | 6/1995 |
| JP | 08-264794 A | 10/1996 |
| JP | 10-078836 A | 3/1998 |
| JP | 10-093423 A | 4/1998 |
| JP | 11-505377 A | 5/1999 |
| JP | 11-261406 A | 9/1999 |
| JP | 2000-044236 A | 2/2000 |
| JP | 2000-077982 A | 3/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-269616 A | 9/2005 |
| JP | 2005-323295 A | 11/2005 |
| JP | 2006-050208 A | 2/2006 |
| JP | 2006-165532 A | 6/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2008-052847 A | 3/2008 |
| JP | 2008-147903 A | 6/2008 |
| JP | 2009-175716 A | 8/2009 |
| JP | 2009-206942 A | 9/2009 |
| JP | 2009-212443 A | 9/2009 |
| JP | 2009-260378 A | 11/2009 |
| JP | 2010-034710 A | 2/2010 |
| JP | 2010-062229 A | 3/2010 |
| JP | 2010-062546 A | 3/2010 |
| JP | 2010-258434 A | 11/2010 |
| JP | 2010-267955 A | 11/2010 |
| WO | 2003/044953 A1 | 5/2003 |
| WO | 2004/059838 A1 | 7/2004 |
| WO | 2004/114391 A1 | 12/2004 |
| WO | 2009/110623 A1 | 9/2009 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

(56) References Cited

OTHER PUBLICATIONS

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center with full English translation.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Nishijima, T et al., "Low-power Display System Driven by Utilizing Technique Using Crystalline IGZO Transistor," SID Digest '12 : SID International Symposium Digest of Technical Papers, 2012, pp. 583-586.

Shukuri, S et al., "A Complementary Gain Cell Technology for sub-1 V Supply DRAMs ," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Yamazaki, S et al., "Research, Development, and Application of Crystalline Oxide Semiconductor," SID Digest '12 : SID International Symposium Digest of Technical Papers, Jun. 5, 2012, pp. 183-186.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214TH ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3,

(56) References Cited

OTHER PUBLICATIONS and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13TH International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English Translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

SIGNAL PROCESSING CIRCUIT

BACKGROUND OF THE INVENTION

1. Field of the Invention

The present invention relates to a storage device that consumes less power by stop of supply of power for a short time, and a signal processing circuit including the storage device. The present invention also relates to methods for driving the storage device and the signal processing circuit. Moreover, the present invention relates to an electronic device including the signal processing circuit.

2. Description of the Related Art

Circuit operation has been complicated with higher integration and larger scale of semiconductor integrated circuits. In addition, the leakage current of transistors is increased with miniaturization of semiconductor integrated circuit processes, and unnecessary power is consumed by the leakage current even while a semiconductor integrated circuit does not operate.

In view of the above, there has been proposed a method in which supply of power to a semiconductor integrated circuit is temporarily stopped in a period during which the semiconductor integrated circuit does not operate. For example, Patent Document 1 discloses a method in which a nonvolatile storage device is disposed around a volatile storage device such as a register or a cache memory so that data in the register, the cache memory, or the like is temporarily stored in the nonvolatile storage device.

In the case where supply of power is stopped for a long time with the above method, data in the volatile storage device can be prevented from being lost by being transferred to an external storage device such as a hard disk or flash memory before supply of power is stopped.

REFERENCE

Patent Document 1: Japanese Published Patent Application No. H7-141074

SUMMARY OF THE INVENTION

However, in the case where data in the volatile storage device is stored in the external storage device while supply of power is stopped, it takes a long time to return the data from the external storage device to the volatile storage device. Data backup using the external storage device is thus not suitable for the case where supply of power is stopped for a short time to reduce consumed power.

Since the nonvolatile storage device disposed around the volatile storage device is mostly composed of magnetic elements or ferroelectric elements, the process of fabricating a signal processing circuit is complicated. For example, a rare-earth element is used for a magnetic element; therefore, it requires special attention to incorporate a process of the magnetic element into a silicon semiconductor process, which is sensitive to metal contamination.

In view of the above problems, an object of one embodiment of the present invention is to provide a signal processing circuit that consumes less power by stop of supply of power for a short time. Another object of one embodiment of the present invention is to provide a low-power-consumption signal processing circuit fabricated without a complicated fabrication process.

In a signal processing circuit of one embodiment of the present invention, a storage element in which data in a first storage circuit is written into a second storage circuit before supply of power is stopped and a verification circuit can determine whether the data held in the first storage circuit matches the data read from the second storage circuit or not is used for a storage device such as a register or a cache memory. When supply of power to the storage element is restarted, the data in the second storage circuit is written into the first storage circuit so that the data is held again in the first storage circuit, and the verification circuit determines whether or not the data read from the second storage circuit matches the data held again in the first storage circuit.

A signal processing circuit of one embodiment of the present invention includes a first storage circuit, a second storage circuit, a verification circuit, a first switch, a second switch, an inverter, a first power supply line having a low potential, and a second power supply line having a high potential. The first storage circuit holds first data only in a period during which power is supplied, and outputs a data signal. The second storage circuit holds second data corresponding to the first data in accordance with a first control signal. The first switch and the second switch electrically connect the first power supply line and an input terminal of the inverter through the second storage circuit or electrically connect the second power supply line and the input terminal of the inverter, in accordance with a second control signal. The inverter outputs the second data held in the second storage circuit, from an output terminal. The verification circuit determines whether the first data and the second data match or not, and supply of the power to the first storage circuit is stopped when the verification circuit determines that the first data and the second data match.

In the signal processing circuit with the above structure, when supply of the power to the first storage circuit is restarted, the first switch and the second switch electrically connect the first power supply line and the input terminal of the inverter through the second storage circuit or electrically connect the second power supply line and the input terminal of the inverter, in accordance with the second control signal. The second data held in the second storage circuit is output from the output terminal of the inverter. The second data is held again in the first storage circuit as the first data. The verification circuit determines whether the first data and the second data match or not.

In the signal processing circuit with the above structure, the verification circuit includes a selection circuit and an inverter.

In the signal processing circuit with the above structure, the second storage circuit includes a first transistor, a second transistor, and a capacitor. A channel of the first transistor is formed in an oxide semiconductor layer. The first transistor is formed over a layer where the second transistor is formed.

The transistor whose channel is formed in the oxide semiconductor layer has an element structure and an operation principle similar to those of a transistor using silicon, except that the channel formation region is made of metal oxide; therefore, the transistor is highly compatible with an integrated circuit using silicon.

According to one embodiment of the present invention, a signal processing circuit that consumes less power by stop of supply of power for a short time can be provided. In addition, a low-power-consumption signal processing circuit fabricated without a complicated fabrication process can be provided.

DETAILED DESCRIPTION OF THE INVENTION

Figure 1:
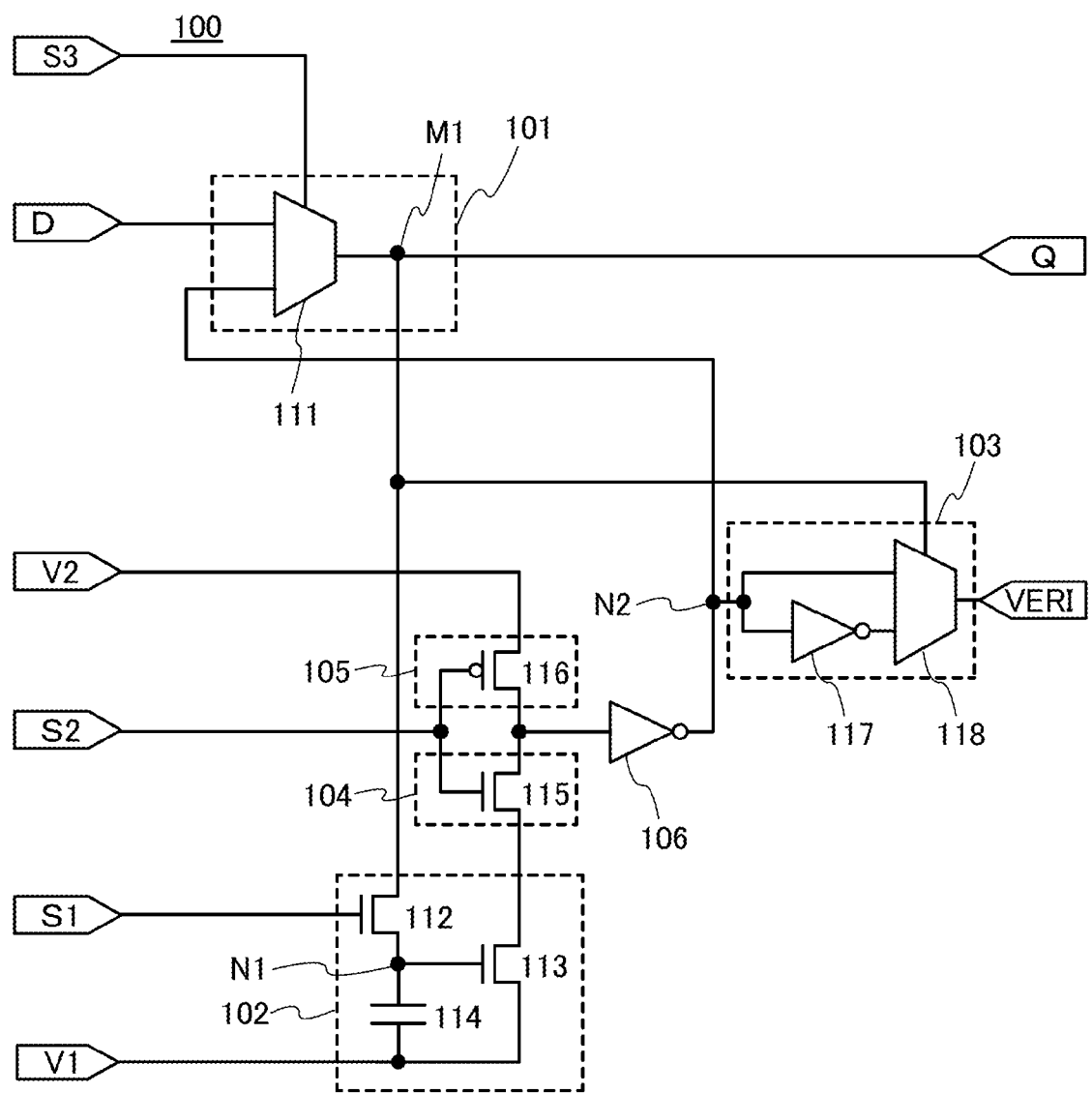
FIG. 1 is a circuit diagram of a storage element.

Hereinafter, embodiments of the present invention will be described in detail with reference to the accompanying drawings. Note that the present invention is not limited to the following description and it is easily understood by those skilled in the art that the mode and details can be variously changed without departing from the scope and spirit of the present invention. Accordingly, the present invention should not be construed as being limited to the description of the embodiments below.

Functions of a source and a drain are sometimes replaced with each other when a transistor of opposite polarity is used or when the direction of current flowing is changed in circuit operation, for example. Therefore, the terms "source" and "drain" can be used to denote the drain and the source, respectively, in this specification.

The term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

Even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

The terms "over" and "below" do not necessarily mean "directly on" and "directly under", respectively, in the description of a physical relationship between components. For example, the expression "a gate electrode over a gate insulating layer" can mean the case where there is an additional component between the gate insulating layer and the gate electrode. Moreover, the terms such as "over" and "below" are simply used for convenience of explanation.

The position, size, range, or the like of each component illustrated in drawings and the like is not accurately represented in some cases for easy understanding. Therefore, the disclosed invention is not necessarily limited to the position, size, range, or the like disclosed in the drawings and the like.

The ordinal numbers such as "first", "second", and "third" are used in order to avoid confusion among components.

Embodiment 1

A signal processing circuit includes a storage device. The storage device includes one or a plurality of storage elements that can store 1-bit data.

Note that a signal processing circuit of the present invention includes, in its category, large scale integrated circuits (LSIs) such as a CPU, a microprocessor, an image processing circuit, a digital signal processor (DSP), and a field programmable gate array (FPGA), and the like.

First, a storage element of one embodiment of the present invention will be described with reference to FIG. 1 and FIG. 2.

(Configuration of Storage Element)

A storage element 100 illustrated in FIG. 1 includes a storage circuit 101 (also called first storage circuit), a storage circuit 102 (also called second storage circuit), a verification circuit 103, a switch 104, a switch 105, and an inverter 106. The storage circuit 101 is a volatile storage circuit that holds first data at a node M1 only in a period during which power is supplied and outputs an output signal Q. Note that the storage circuit 101 may also include a switch, an analog switch, or the like as appropriate.

The storage circuit 102 includes a transistor 112, a transistor 113, and a capacitor 114. One of a source and a drain of the transistor 112 is electrically connected to a gate of the transistor 113 and one of electrodes of the capacitor 114 to form a node N1. The other of the source and the drain of the transistor 112 is electrically connected to the node M1 in the storage circuit 101. The on/off state of the transistor 112 is controlled depending on a control signal S1.

In the transistor 112 in the storage circuit 102, a channel is formed in a semiconductor that has a wider bandgap and lower intrinsic carrier density than silicon, for example. Such a semiconductor preferably has a bandgap at least twice as wide as that of silicon, for example, and an oxide semiconductor such as gallium oxide, a nitride semiconductor such as gallium nitride, and a compound semiconductor such as silicon carbide and gallium arsenide can be used, for instance.

In this embodiment, the case of using an oxide semiconductor for a semiconductor included in the transistor 112 is described.

The oxide semiconductor used for the transistor 112 is preferably a purified oxide semiconductor in which impurities serving as electron donors (donors), such as water or hydrogen, are reduced and oxygen vacancies are reduced. The purified oxide semiconductor is an i-type (intrinsic) semiconductor or a substantially i-type semiconductor; therefore, a transistor including the purified oxide semiconductor has significantly low off-state current. The bandgap of the oxide semiconductor is 2 eV or more, preferably 2.5 eV or more, further preferably 3.0 eV or more. With the use of an oxide semiconductor film that is purified by sufficient reduction in the concentration of impurities such as water or hydrogen and by reduction in oxygen vacancies, the off-state current of the transistor can be significantly reduced.

Note that in this specification and the like, off-state current is a current that flows between a source and a drain when a transistor is off. In the case of an n-channel transistor (e.g., with a threshold voltage of about 0 V to 2 V), the off-state current means a current that flows between a source and a drain when a negative voltage is applied between a gate and the source.

Various experiments can prove low off-state current of the transistor including the purified oxide semiconductor film. For example, even when an element has a channel width of $1 \times 10^6$ μm and a channel length of 10 μm, the off-state current can be lower than or equal to the measurement limit of a semiconductor parameter analyzer, that is, lower than or equal to $1\times10^{-13}$ A at a voltage between a source and a drain (a drain voltage) of 1 V to 10 V. In this case, the off-state current density corresponding to a value obtained by dividing the off-state current by the channel width of the transistor is found to be less than or equal to 100 zA/μm. In addition, the off-state current is measured using a circuit in which a capacitor and a transistor are connected to each other and charge flowing into or from the capacitor is controlled by the transistor. In the measurement, the purified oxide semiconductor film is used for a channel formation region in the transistor, and the off-state current density of the transistor is measured from change in the amount of charge of the capacitor per unit time. As a result, it is found that when the voltage between the source and the drain of the transistor is 3 V, a lower off-state current density of several tens of yoctoamperes per micrometer (yA/μm) is obtained. Consequently, it can be said that a transistor in which a channel formation region is used for the purified oxide semiconductor film has much lower off-state current than a transistor including silicon.

As above, with the use of a transistor in which a channel is formed in an oxide semiconductor film as the transistor 112, the amount of charge leaking through the transistor 112 can be significantly reduced even when the transistor 112 is turned off after the potential of the node N1, where one of the source and the drain of the transistor 112 is electrically connected to one of the electrodes of the capacitor 114, is kept constant. Consequently, turning off the transistor 112 after the potential of second data corresponding to the first data is held at the node N1 can maintain the potential of the second data for a long time.

One of a source and a drain of the transistor 113 and the other of the electrodes of the capacitor 114 are electrically connected to a first power supply line V1 supplied with a low potential (e.g., VSS). The other of the source and the drain of the transistor 113 is electrically connected to a first terminal of the switch 104. A second terminal of the switch 104 is electrically connected to a first terminal of the switch 105 and an input terminal of the inverter 106. A second terminal of the switch 105 is electrically connected to a second power supply line V2 supplied with a high potential (e.g., VDD).

The switch 104 is configured with a transistor 115 having one conductivity type (e.g., an n-channel transistor), and the switch 105 is configured with a transistor 116 having another conductivity type (e.g., a p-channel transistor). The first terminal of the switch 104 corresponds to one of a source and a drain of the transistor 115, and the second terminal of the switch 104 corresponds to the other of the source and the drain of the transistor 115. The first terminal of the switch 105 corresponds to one of a source and a drain of the transistor 116, and the second terminal of the switch 105 corresponds to the other of the source and the drain of the transistor 116. In each of the switches 104 and 105, conduction or non-conduction between the first terminal and the second terminal is selected by a control signal S2. When there is conduction between the first terminal and the second terminal of one of the switches, there is no conduction between the first terminal and the second terminal of the other switch.

For example, when the control signal S2 has a high potential, there is conduction between the first terminal and the second terminal of the switch 104 and there is no conduction between the first terminal and the second terminal of the switch 105, so that the first power supply line V1 and the input terminal of the inverter 106 are electrically connected to each other through the transistor 113. When the control signal S2 has a low potential, there is conduction between the first terminal and the second terminal of the switch 105 and there is no conduction between the first terminal and the second terminal of the switch 104, so that the second power supply line V2 and the input terminal of the inverter 106 are electrically connected to each other.

When the input terminal of the inverter 106 is electrically connected to the first power supply line V1 or the second power supply line V2, the second data corresponding to the first data is output from an output terminal of the inverter 106.

The verification circuit 103 has a function of determining whether the first data and the second data match or not. The verification circuit 103 includes an inverter 117 and a selection circuit 118. The output terminal of the inverter 106 is electrically connected to one of input terminals of the selection circuit 118 and to the other of the input terminals of the selection circuit 118 through the inverter 117. The selection circuit 118 selects one or the other of the input terminals depending on the potential of the node M1 and outputs an output signal VERI from the output terminal. Note that a portion where the output terminal of the inverter 106 and the verification circuit 103 are connected is referred to as a node N2.

The storage circuit 101 includes a selection circuit 111. A signal line to which a data signal D is input is electrically connected to one of input terminals of the selection circuit 111. The output terminal of the inverter 106 (the node N2) is electrically connected to the other of the input terminals of the selection circuit 111. The selection circuit 111 selects one or the other of the input terminals depending on a control signal S3.

The transistors 113, 115, and 116 and the like, except the transistor 112, can be transistors in which a channel is formed in a layer or a substrate formed of a semiconductor other than an oxide semiconductor. For example, these transistors can be ones in which a channel is formed in a silicon region such as a silicon layer or a silicon substrate. Alternatively, the storage element 100 may include a transistor in which a channel is formed in an oxide semiconductor region, in addition to the transistor 112, and the other transistors can be transistors in which a channel is formed in a layer or a substrate formed of a semiconductor other than an oxide semiconductor.

The transistor 112 may have two gates so that an oxide semiconductor layer is placed therebetween. The control signal S2 for controlling the on/off state of the transistor 112 is supplied to one of the gates, and the other of the gates may be in a floating state (i.e., electrically insulated) or may be supplied with a potential from another element. In the latter case, potentials with the same level may be applied to the pair of electrodes, or a fixed potential such as a ground potential may be applied only to the other of the gates. By controlling the level of the potential applied to the other of the gates, the threshold voltage of the transistor can be controlled.

The above is the description of the configuration of the storage element 100.

Next, a storage element that is partly different from the storage element illustrated in FIG. 1 will be described with reference to FIG. 2.

Figure 2:
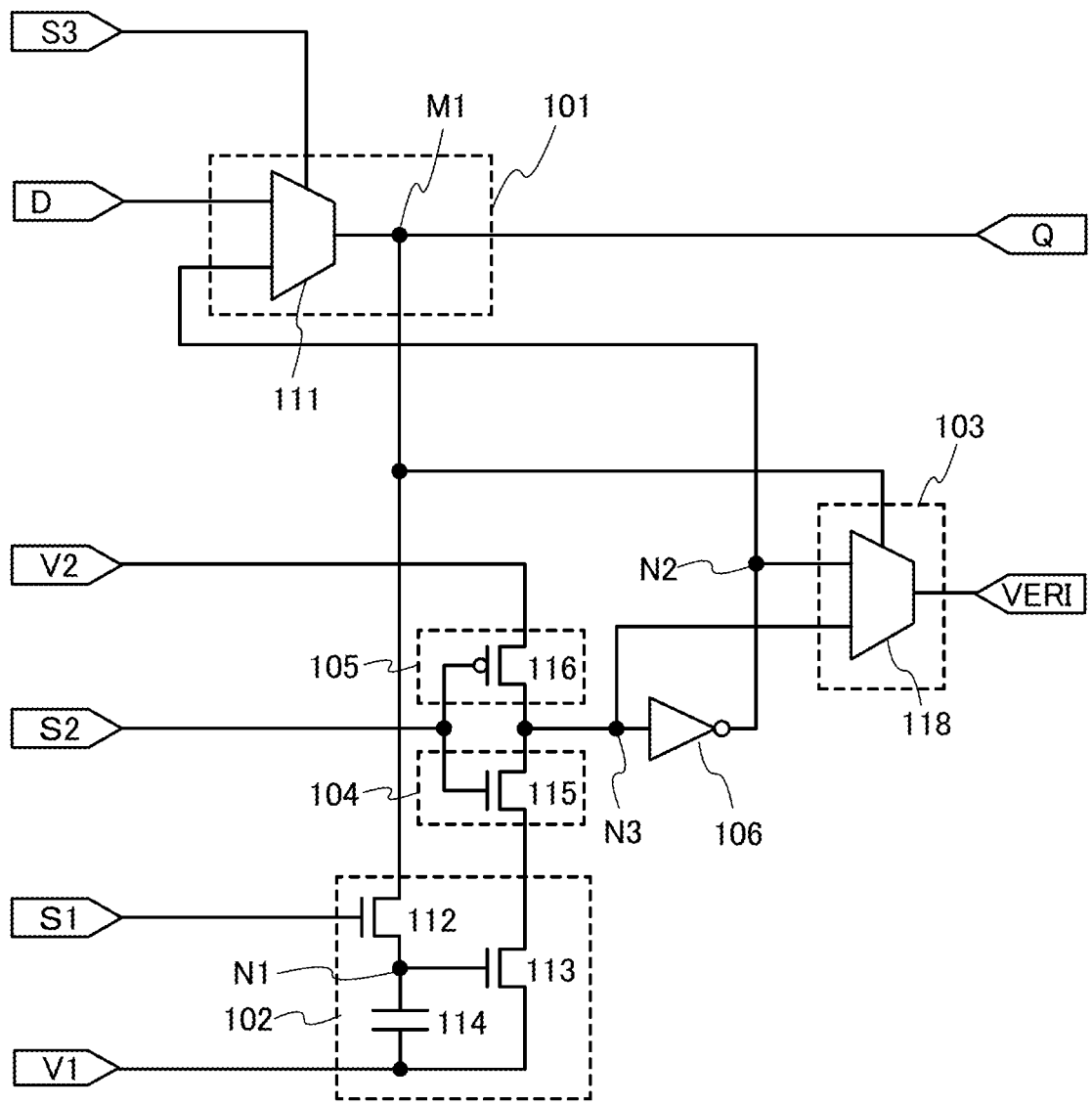
FIG. 2 is a circuit diagram of a storage element.

A storage element 150 illustrated in FIG. 2 differs from the storage element 100 illustrated in FIG. 1 in the configuration of the verification circuit 103. The verification circuit 103 in the storage element 150 in FIG. 2 includes the selection circuit 118 but does not include the inverter 117. The output terminal of the inverter 106 is electrically connected to one of the input terminals of the selection circuit 118. The input terminal of the inverter 106 is electrically connected to the other of the input terminals of the selection circuit 118. The selection circuit 118 selects one or the other of the input terminals depending on the potential of the node M1. Note that a portion where the input terminal of the inverter 106 and the verification circuit 103 are connected is referred to as a node N3.

One of the input terminals of the selection circuit 118 is electrically connected to the output terminal of the inverter 106 and the other is electrically connected to the input terminal of the inverter 106, whereby the number of transistors can be reduced as compared to the storage element 100 illustrated in FIG. 1. As a result, the area of the storage element 150 can be smaller than that of the storage element 100.

(Method for Driving Storage Element)

Figure 3:
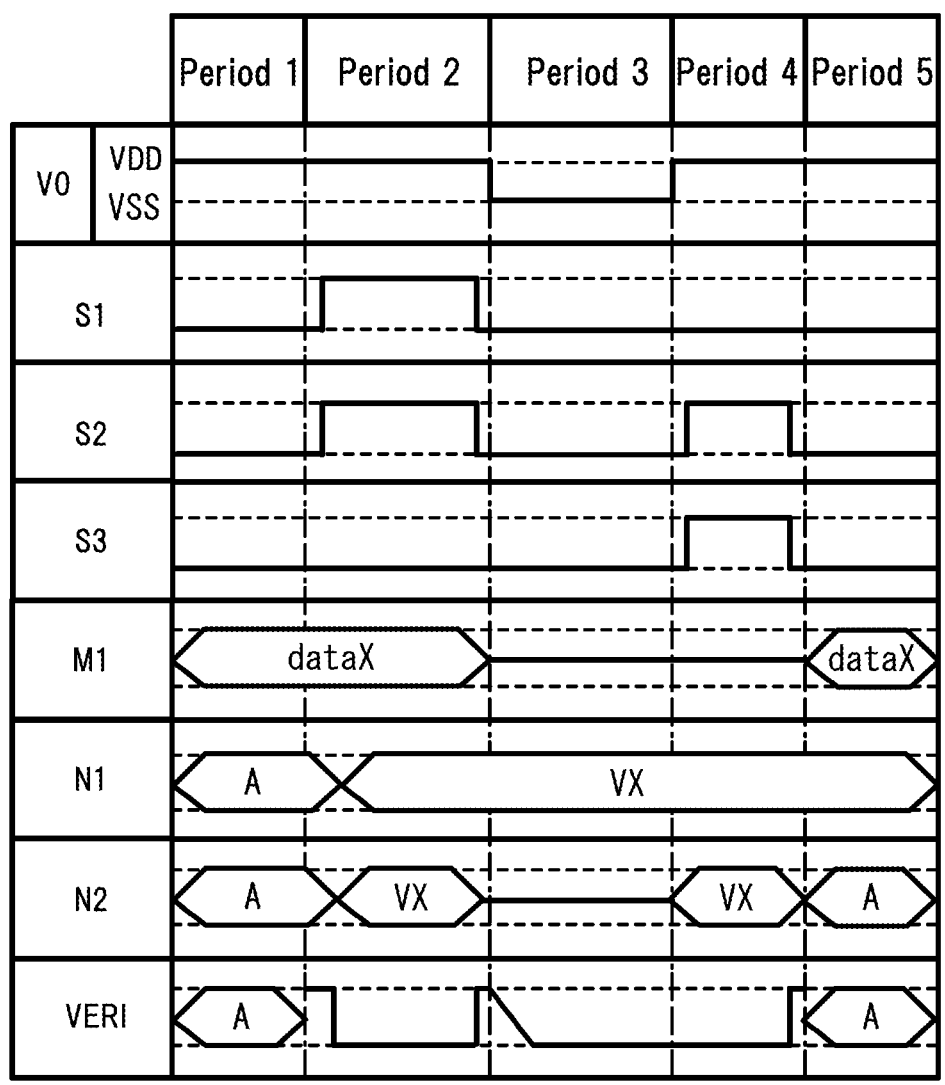
FIG. 3 is a timing chart showing the operation of a storage element.

Next, the description is made with reference to FIG. 3 on a method for driving the storage element 100 in FIG. 1 when power is supplied to the storage element 100, and then supply of power is stopped to reduce power consumption in data retention, and power is supplied again.

In the timing chart in FIG. 3, V0 represents power for the entire storage element 100; S1, the potential of the control signal S1; S2, the potential of the control signal S2; S3, the potential of the control signal S3; M1, the potential of the node M1; N1, the potential of the node N1; N2, the potential of the node N2; and VERI, the potential of the output signal VERI of the verification circuit 103.

One of the input terminals of the selection circuit 111 is selected when a low potential is input to the selection circuit 111 as the control signal S3, whereas the other of the input terminals is selected when a high potential is input to the selection circuit 111. One of the input terminals of the selection circuit 118 is selected when a low potential is input to the selection circuit 118 as the potential of the node M1, whereas the other of the input terminals is selected when a high potential is input to the selection circuit 118.

(Normal Operation)

The operation in Period 1 in FIG. 3 is described. In Period 1, power is supplied to the storage element 100. Here, the power V0 is a high potential (e.g., VDD). The control signal S1, the control signal S2, and the control signal S3 have a low potential. When the control signal S3 has the low potential, one of the input terminals of the selection circuit 111 is electrically connected to the signal line to which the data signal D is input, and first data (dataX in FIG. 3) corresponding to the data signal D is output from the output terminal of the selection circuit 111. The storage circuit 101 holds the first data at the node M1 while power is supplied to the storage element 100. The node N1 and the node N2 can have any potential (represented by A in FIG. 3), and the output signal VERI can also have any potential (A in FIG. 3). Since the control signal S2 has the low potential, there is no conduction between the first terminal and the second terminal of the switch 104 and there is conduction between the first terminal and the second terminal of the switch 105; thus, the input terminal of the inverter 106 and the second power supply line V2 are electrically connected to each other, and the high potential is input to the input terminal of the inverter 106. The above operation in Period 1 is referred to as normal operation.

(Operation before Stop of Power Supply)

The operation in Period 2 in FIG. 3 is described. In Period 2, before supply of power to the storage element 100 is stopped, the control signal S1 is set at the high potential so that the transistor 112 is turned on. Thus, the potential of the first data held at the node M1 in the storage circuit 101 is input to the gate of the transistor 113 through the transistor 112. The potential input to the gate of the transistor 113 is held by the capacitor 114. In this manner, the potential (VX in FIG. 3) of second data corresponding to the first data held in the storage circuit 101 is written into the node N1.

When the second data held at the node N1 in the storage circuit 102 has the high potential, to read the second data, the control signal S2 is set at the high potential so that the first terminal and the second terminal of the switch 104 are brought into conduction and the first terminal and the second terminal of the switch 105 are brought out of conduction. Since the node N1 has the high potential, the transistor 113 is turned on, and the first power supply line V1 and the input terminal of the inverter 106 are electrically connected to each other through the transistor 113. Thus, the low potential is input to the input terminal of the inverter 106, instead of the high potential which has been input in the normal operation. In this manner, the potential of the node N2 becomes the potential (VX in FIG. 3) of the second data held in the storage circuit 102.

The verification circuit 103 determines whether the first data and the second data match or not. When both the potential at the node M1 and the potential at the node N2 are the low potential or the high potential, the verification circuit 103 outputs the low potential as the output signal VERI.

Since the first data held at the node M1 has the high potential, the high potential is input to the selection circuit 118, and the high potential of the second data at the node N2 is input to the other of the input terminals of the selection circuit 118 through the inverter 117. Thus, the low potential is output from the output terminal of the selection circuit 118 as the output signal VERI. When a control circuit (not illustrated) senses the low potential as the output signal VERI during a predetermined period, the control circuit determines that the first data at the node M1 and the second data at the node N2 match.

When the second data held at the node N1 has the low potential, to read the second data, the control signal S2 is set at the high potential so that the first terminal and the second terminal of the switch 104 are brought into conduction and the first terminal and the second terminal of the switch 105 are brought out of conduction. Since the node N1 has the low potential, the transistor 113 is turned off, so that the input terminal of the inverter 106 is electrically connected to neither the first power supply line V1 nor the second power supply line V2. Accordingly, the high potential, which has been input to the input terminal of the inverter 106 in the normal operation, is held without change, and the low potential is output from the output terminal of the inverter 106. In this manner, the potential of the node N2 becomes the potential of the second data held in the storage circuit 102.

Since the first data held at the node M1 has the low potential, the low potential is input to the selection circuit 118, and the low potential of the second data at the node N2 is input to one of the input terminals of the selection circuit 118. Thus, the low potential is output from the output terminal of the selection circuit 118 as the output signal VERI. When the control circuit (not illustrated) senses the low potential as the output signal VERI during a predetermined period, the control circuit determines that the first data at the node M1 and the second data at the node N2 match.

When the control circuit determines that the first data and the second data match, the control signal S1 and the control signal S2 are set at the low potential, and writing of the second data into the storage circuit 102 is terminated.

The above operation in Period 2 is called the operation before stop of supply of power.

(Operation of Stopping Power Supply)

The operation in Period 3 in FIG. 3 is described. After the operation before stop of supply of power is performed, supply of power to the storage element 100 is stopped at the beginning of Period 3. Here, the power V0 is set at a low potential (e.g., VSS). When supply of power to the storage element 100 is stopped, the first data (dataX) held in the storage circuit 101 is lost. However, in the storage circuit 102, a potential held by the capacitor 114 can be maintained for a long time because the transistor 112 has extremely low off-state current since its channel is formed in an oxide semiconductor. Accordingly, the storage element 100 can hold the second data (VX) in the storage circuit 102 even after supply of power is stopped. The above operation in Period 3 is called the operation of stopping supply of power.

(Operation of Restarting Power Supply)

The operation in Period 4 in FIG. 3 is described. Supply of power to the storage element 100 is restarted. Here, the power V0 is set at the high potential. Since the control signal S2 has the low potential, there is no conduction between the first terminal and the second terminal of the switch 104 and there is conduction between the first terminal and the second terminal of the switch 105; thus, the input terminal of the inverter 106 and the second power supply line V2 are electrically connected to each other, and the high potential is input to the input terminal of the inverter 106.

When the second data that has been held at the node N1 in the storage circuit 102 has the high potential, to read the second data, the control signal S2 is set at the high potential so that the first terminal and the second terminal of the switch 104 are brought into conduction and the first terminal and the second terminal of the switch 105 are brought out of conduction. Since the node N1 has the high potential, the transistor 113 is turned on, and the first power supply line V1 and the input terminal of the inverter 106 are electrically connected to each other through the transistor 113. Thus, the high potential is output from the output terminal of the inverter 106. In this manner, the potential of the node N2 becomes the potential (VX in FIG. 3) of the second data held in the storage circuit 102.

At this time, the high potential is input to the selection circuit 111 as the control signal S3, whereby the other of the input terminals of the selection circuit 111 is selected. Accordingly, the other of the input terminals of the selection circuit 111 and the node M1 are electrically connected to each other, and the first data corresponding to the second data is output from the output terminal of the selection circuit 111. In such a manner, the storage circuit 101 can again hold the high potential as the first data (dataX) which was held before stop of supply of power.

Since the first data that is held again at the node M1 has the high potential, the high potential is input to the selection circuit 118, and the high potential is input to the other of the input terminals of the selection circuit 118 through the inverter 117 as the second data at the node N2. Thus, the low potential is output from the output terminal of the selection circuit 118 as the output signal VERI. When the control circuit (not illustrated) senses the low potential as the output signal VERI during a predetermined period, the control circuit determines that the first data at the node M1 and the second data at the node N2 match.

When the second data that has been held at the node N1 in the storage circuit 102 has the low potential, to read the second data, the control signal S2 is set at the high potential so that the first terminal and the second terminal of the switch 104 are brought into conduction and the first terminal and the second terminal of the switch 105 are brought out of conduction. Since the node N1 has the low potential, the transistor 113 is turned off, so that the input terminal of the inverter 106 is electrically connected to neither the first power supply line V1 nor the second power supply line V2. Since the input terminal of the inverter 106 has the high potential, the low potential is output from the output terminal of the inverter 106. In this manner, the potential of the node N2 becomes the potential of the second data held in the storage circuit 102.

At this time, the high potential is input to the selection circuit 111 as the control signal S3, whereby the other of the input terminals of the selection circuit 111 is selected. Accordingly, the other of the input terminals of the selection circuit 111 and the node M1 are electrically connected to each other, and the first data corresponding to the second data is output from the output terminal of the selection circuit 111. In such a manner, the storage circuit 101 can again hold the low potential as the first data (dataX) which was held before stop of supply of power.

Since the first data that is held again at the node M1 has the low potential, by input of the low potential to the selection circuit 118, the low potential is input to one of the input terminals of the selection circuit 118 as the second data at the node N2. Thus, the low potential is output from the output terminal of the selection circuit 118 as the output signal VERI. When the control circuit (not illustrated) senses the low potential as the output signal VERI during a predetermined period, the control circuit determines that the first data at the node M1 and the second data at the node N2 match.

When the control circuit determines that the first data and the second data match, the control signal S2 and the control signal S3 are set at the low potential.

The above operation in Period 4 is called the operation of restarting supply of power.

Then, in Period 5, the normal operation is resumed.

In the storage element and the driving method thereof in one embodiment of the present invention, in a period during which power is not supplied to the storage element 100, data that has been held in the storage circuit 101 can be held by the storage circuit 102.

The transistor 112 used in the storage circuit 102 is a transistor in which a channel is formed in an oxide semiconductor. The off-state current of the transistor is much lower than that of a transistor in which a channel is formed in a semiconductor such as silicon. For this reason, with the use of the transistor using an oxide semiconductor as the transistor 112, the amount of charge leaking through the transistor 112 can be significantly reduced even when the transistor 112 is turned off after the potential of the node N1, where one of the source and the drain of the transistor 112 is electrically connected to one of the electrodes of the capacitor 114, is kept constant. That is, the potential held in the capacitor 114 can be maintained for a long time even in a period during which power is not supplied to the storage element 100. By being configured with such a transistor 112, the storage element can hold the memory contents (data) even while supply of power is stopped.

In the storage element 100, before supply of power is stopped, data held in the storage circuit 101 is stored to the storage circuit 102, and the data is read from the storage circuit 102 and whether or not the data held in the storage circuit 102 matches the data that has been held in the storage circuit 101 can be determined by the verification circuit 103. After supply of power is restarted, the data in the storage circuit 102 is restored to the storage circuit 101, and whether or not the data held in the storage circuit 102 matches the data returned to the storage circuit 101 can be determined by the verification circuit 103. In such a manner, without additionally requiring a time for verification, the storage element 100 can perform verification at the same time as storage of data from the storage circuit 101 to the storage circuit 102 or restoration of data from the storage circuit 102 to the storage circuit 101.

In the case where a storage device such as a register or a cache memory is configured with a plurality of such storage elements, even when a time necessary to write data varies between the storage elements, data can be normally written with a control circuit that controls data writing to continue until data writing into each storage element is completed.

Configuring a storage device in a signal processing circuit by using one or more of such storage elements 100 can prevent data in the storage device from being lost by stop of supply of power. In addition, after supply of power is restarted, the signal processing circuit can return to the state before stop of supply of power in a short time. Consequently, supply of power to the storage device can be stopped even for a short time, thereby reducing power consumption of the whole signal processing circuit or one or more storage devices configuring the signal processing circuit.

This embodiment can be implemented in combination with any of the other embodiments.

Embodiment 2

In this embodiment, a storage element that includes an additional second storage circuit for replacing a second storage circuit in which a defect occurs will be described with reference to FIG. 4, FIG. 5, and FIG. 6.

Figure 4:
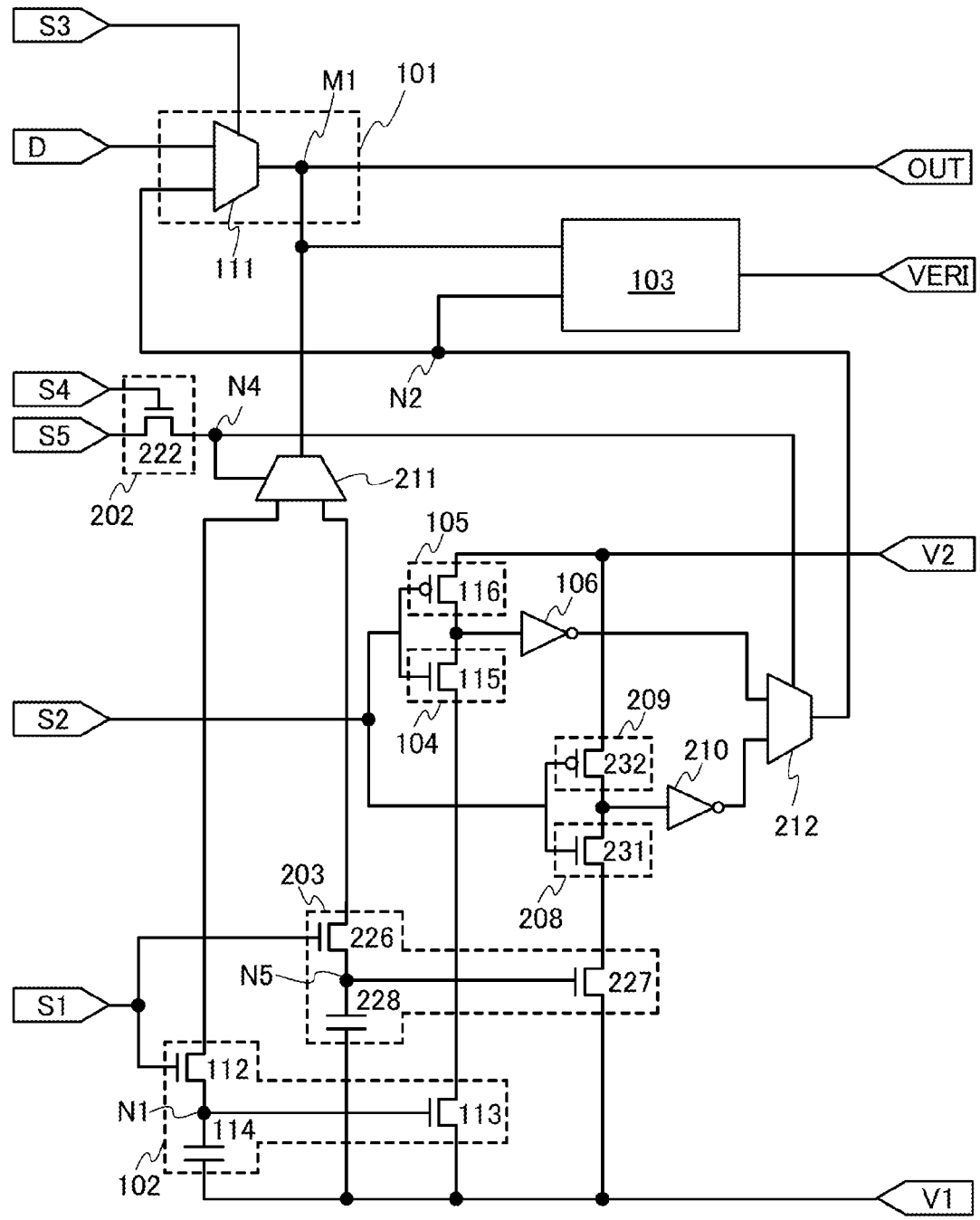
FIG. 4 is a circuit diagram of a storage element.

Like the storage element 100 illustrated in FIG. 1, a storage element 200 illustrated in FIG. 4 includes the storage circuit 101, the storage circuit 102, the verification circuit 103, the switch 104, the switch 105, and the inverter 106. The storage element 200 also includes a switch 202, a storage circuit 203, a switch 208, a switch 209, an inverter 210, a selection circuit 211, and a selection circuit 212. Here, the storage circuit 203 has a structure similar to that of the storage circuit 102; the switch 208 has a structure similar to that of the switch 104; the switch 209 has a structure similar to that of the switch 105; and the inverter 210 has a structure similar to that of the inverter 106.

A first terminal of the switch 202 is electrically connected to a signal line to which a control signal S5 is input. A second terminal of the switch 202 is electrically connected to the selection circuit 211 and the selection circuit 212. A portion where the switch 202 is connected to the selection circuit 211 and the selection circuit 212 is referred to as a node N4.

The switch 202 is configured with a transistor 222 in which a channel is formed in an oxide semiconductor. The first terminal of the switch 202 corresponds to one of a source and a drain of the transistor 222, and the second terminal of the switch 202 corresponds to the other of the source and the drain of the transistor 222. Conduction or non-conduction between the first terminal and the second terminal of the switch 202 is selected by a control signal S4.

With the use of the transistor 222 having the channel formed in an oxide semiconductor film for the switch 202, the amount of charge leaking through the transistor 222 can be significantly reduced even when the transistor 222 is turned off after the potential of the node N4 is kept constant. Consequently, turning off the transistor 222 after the potential of the control signal S5 is held at the node N4 can maintain the potential of the node N4 for a long time.

An input terminal of the selection circuit 211 is electrically connected to the node M1. One of output terminals of the selection circuit 211 is electrically connected to the storage circuit 102, and the other of the output terminals is electrically connected to the storage circuit 203. The selection circuit 211 selects one or the other of the output terminals depending on the potential of the node N4.

The storage circuit 102 includes the transistor 112, the transistor 113, and the capacitor 114. One of the source and the drain of the transistor 112 is electrically connected to the gate of the transistor 113 and one of the electrodes of the capacitor 114 to form the node N1.

The storage circuit 203 has a structure similar to that of the storage circuit 101 and can be used in place of the storage circuit 102. The storage circuit 203 includes a transistor 226, a transistor 227, and a capacitor 228. One of a source and a drain of the transistor 226 is electrically connected to a gate of the transistor 227 and one of electrodes of the capacitor 228 to form a node N5.

The other of the source and the drain of the transistor 112 is connected to one of the output terminals of the selection circuit 211. The other of the source and the drain of the transistor 226 is connected to the other of the output terminals of the selection circuit 211. The on/off state of each of the transistors 112 and 226 is controlled depending on the control signal S1.

As in the case of the transistor 112, a transistor in which a channel is formed in an oxide semiconductor is used as the transistor 226. Thus, the amount of charge leaking through the transistor 226 can be significantly reduced even when the transistor 226 is turned off after the potential of the node N5, where one of the source and the drain of the transistor 226 is electrically connected to one of the electrodes of the capacitor 228, is kept constant. Consequently, turning off the transistor 226 after the potential of second data corresponding to first data is held at the node N5 can maintain the potential of the second data for a long time.

One of the source and the drain of the transistor 113, the other of the electrodes of the capacitor 114, one of a source and a drain of the transistor 227, and the other of the electrodes of the capacitor 228 are electrically connected to the first power supply line V1, to which the low potential is applied.

The other of the source and the drain of the transistor 113 is electrically connected to the first terminal of the switch 104. The second terminal of the switch 104 is electrically connected to the first terminal of the switch 105 and the input terminal of the inverter 106.

The other of the source and the drain of the transistor 227 is electrically connected to a first terminal of the switch 208. A second terminal of the switch 208 is electrically connected to a first terminal of the switch 209 and an input terminal of the inverter 210.

The second terminal of the switch 105 and a second terminal of the switch 209 are electrically connected to the second power supply line V2, to which the high potential is applied.

The switch 208 is configured with a transistor 231 having one conductivity type (e.g., an n-channel transistor), and the switch 209 is configured with a transistor 232 having another conductivity type (e.g., a p-channel transistor). The first terminal of the switch 208 corresponds to one of a source and a drain of the transistor 231, and the second terminal of the switch 208 corresponds to the other of the source and the drain of the transistor 231. The first terminal of the switch 209 corresponds to one of a source and a drain of the transistor 232, and the second terminal of the switch 209 corresponds to the other of the source and the drain of the transistor 232. In each of the switches 208 and 209, conduction or non-conduction between the first terminal and the second terminal is selected by the control signal S2. When there is conduction between the first terminal and the second terminal of one of the switches, there is no conduction between the first terminal and the second terminal of the other switch.

For example, when the control signal S2 has a high potential, there is conduction between the first terminal and the second terminal of the switch 208 and there is no conduction between the first terminal and the second terminal of the switch 209, so that the first power supply line V1 and the input terminal of the inverter 210 are electrically connected to each other through the transistor 227. When the control signal S2 has a low potential, there is conduction between the first terminal and the second terminal of the switch 209 and there is no conduction between the first terminal and the second terminal of the switch 208, so that the second power supply line V2 and the input terminal of the inverter 210 are electrically connected to each other.

One of input terminals of the selection circuit 212 is electrically connected to the output terminal of the inverter 106, and the other of the input terminals is electrically connected to an output terminal of the inverter 210. The selection circuit 212 selects the output terminal of the inverter 106 or the output terminal of the inverter 210 depending on the potential of the node N4.

When the potential of the node N4 is the low potential, the storage circuit 102 is selected by the selection circuit 211 and the output terminal of the inverter 106 is selected by the selection circuit 212. On the other hand, when the potential of the node N4 is the high potential, the storage circuit 203 is selected by the selection circuit 211 and the output terminal of the inverter 210 is selected by the selection circuit 212.

The verification circuit 103 determines whether the second data output from the selection circuit 212 and the first data held at the node M1 match or not. The verification circuit 103 can have a configuration similar to that in FIG. 1. Here, a portion where the output terminal of the selection circuit 212 and the verification circuit 103 are connected is referred to as the node N2.

The storage circuit 101 includes the selection circuit 111. A signal line to which the data signal D is input is electrically connected to one of input terminals of the selection circuit 111. The output terminal of the selection circuit 212 (the node N2) is electrically connected to the other of the input terminals of the selection circuit 111. The selection circuit 111 selects one or the other of the input terminals depending on the control signal S3.

The transistors 227, 231, and 232 and the like, except the transistors 112, 222, and 226, can be transistors in which a channel is formed in a layer or a substrate formed of a semiconductor other than an oxide semiconductor. For example, these transistors can be transistors in which a channel is formed in a silicon region such as a silicon layer or a silicon substrate. Alternatively, the storage element 200 may include a transistor in which a channel is formed in an oxide semiconductor, in addition to the transistors 112, 222, and 226, and the other transistors can be transistors in which a channel is formed in a semiconductor region such as a semiconductor substrate or a layer formed of a semiconductor other than an oxide semiconductor.

Like the transistor 112, the transistor 226 may have two gates so that an oxide semiconductor layer is placed therebetween. The control signal S2 for controlling the on/off state of the transistor 112 is supplied to one of the gates, and the other of the gates may be in a floating state (i.e., electrically insulated) or may be supplied with a potential from another element. In the latter case, potentials with the same level may be applied to the pair of electrodes, or a fixed potential such as a ground potential may be applied only to the other of the gates. By controlling the level of the potential applied to the other of the gates, the threshold voltage of the transistor can be controlled.

Next, a storage element that is partly different from the storage element illustrated in FIG. 4 will be described with reference to FIG. 5.

Figure 5:
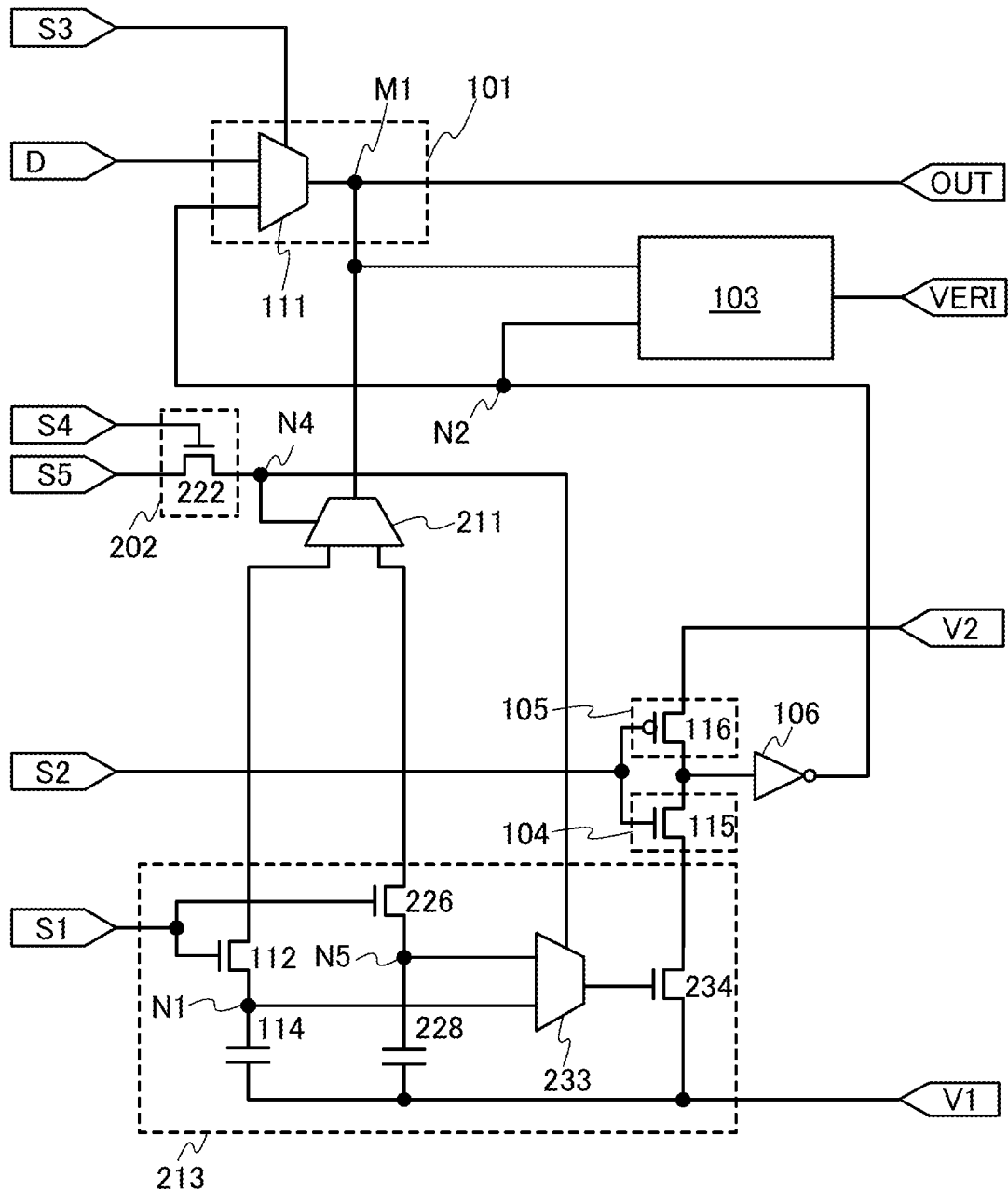
FIG. 5 is a circuit diagram of a storage element.

A storage element 250 illustrated in FIG. 5 differs from the storage element 200 illustrated in FIG. 4 in the configuration of the storage circuit 213. The storage circuit 213 in the storage element 250 in FIG. 5 includes a selection circuit 233 and a transistor 234 but does not include the transistor 113, the transistor 227, the switch 208, the switch 209, the inverter 210, and the selection circuit 212. One of input terminals of the selection circuit 233 is electrically connected to the node N1, and the other of the input terminals is electrically connected to the node N5. An output terminal of the selection circuit 233 is electrically connected to a gate of the transistor 234. The selection circuit 233 selects one or the other of the input terminals depending on the potential of the node N4.

One of a source and a drain of the transistor 234, the other of the electrodes of the capacitor 114, and the other of the electrodes of the capacitor 228 are electrically connected to the first power supply line V1, to which the low potential is applied. The other of the source and the drain of the transistor 234 is electrically connected to the first terminal of the switch 104. The second terminal of the switch 104 is electrically connected to the first terminal of the switch 105 and the input terminal of the inverter 106. The second terminal of the switch 105 is electrically connected to the second power supply line V2.

One of the input terminals of the selection circuit 233 is electrically connected to the node N1 and the other is electrically connected to the node N5, whereby the number of transistors can be reduced as compared to the storage element 200 illustrated in FIG. 4. As a result, the area of the storage element 250 can be smaller than that of the storage element 200.

(Method for Driving Storage Element)

Figure 6:
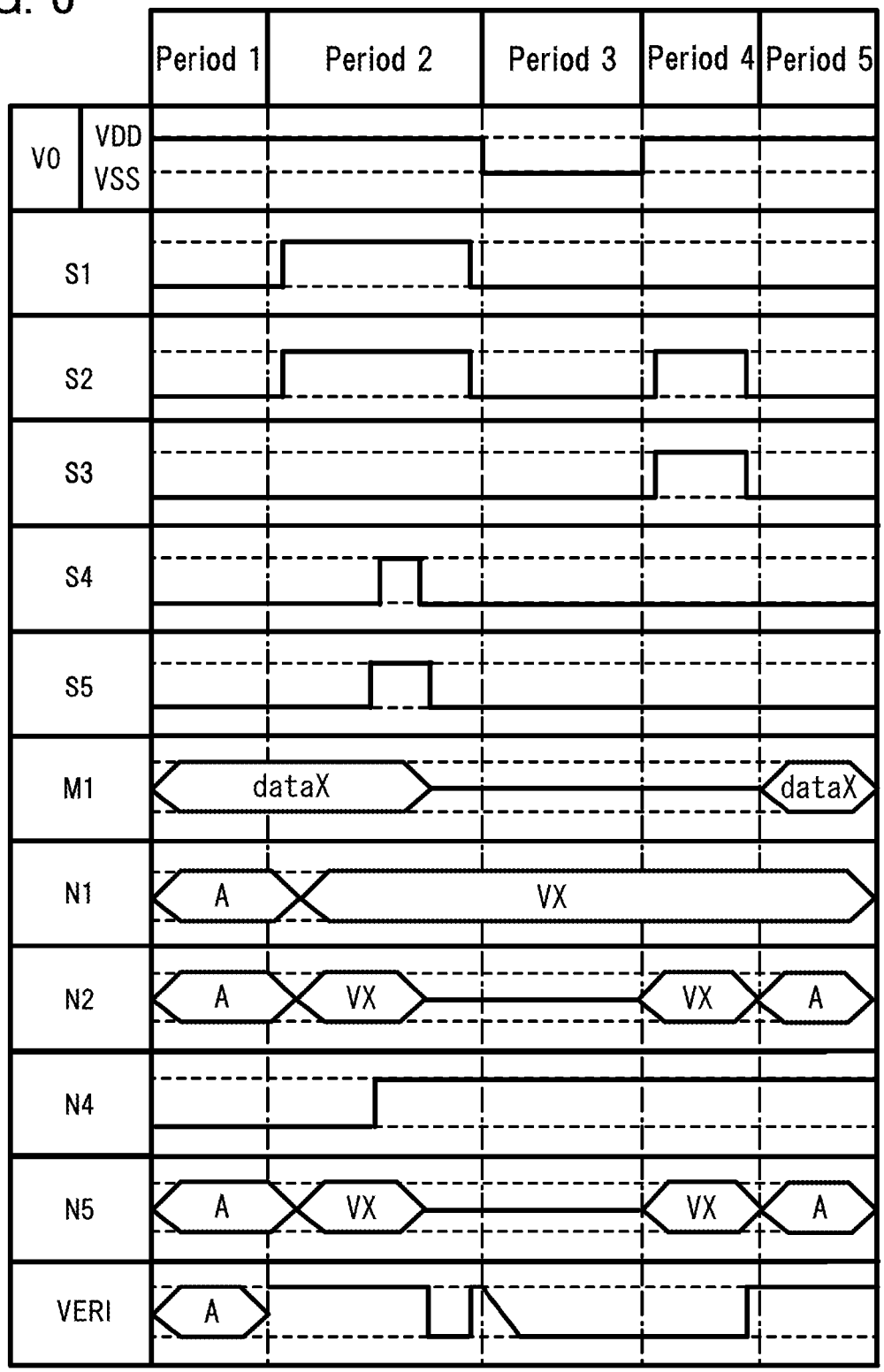
FIG. 6 is a timing chart showing the operation of a storage element.

The description is made with reference to FIG. 4 and FIG. 6 on a method for driving the storage element 200 in FIG. 4 when power is supplied to the storage element 200, and then supply of power is stopped to reduce power consumption in data retention, and power is supplied again.

In this embodiment, the description is made with reference to FIG. 6 on the case where in a period before supply of power is stopped, the verification circuit 103 continues to output the high potential as the output signal VERI for a predetermined period.

(Normal Operation)

The operation in Period 1 in FIG. 6 is described. In Period 1, power is supplied to the storage element 200. Here, the power V0 is VDD (the high potential).

Each of the control signals S1 to S5 has the low potential. The storage circuit 101 holds the first data at the node M1. Since the control signal S2 has the low potential, there is no conduction between the first terminal and the second terminal of each of the switches 104 and 208 and there is conduction between the first terminal and the second terminal of each of the switches 105 and 209. Thus, the input terminal of the inverter 106 and the second power supply line V2 are electrically connected to each other, and the high potential is input to the input terminal of the inverter 106. Moreover, the input terminal of the inverter 210 and the second power supply line V2 are electrically connected to each other, and the high potential is input to the input terminal of the inverter 210. There is no limitation on the level of the potentials of the nodes N1, N2, and N5. The potential of the node N4 is the low potential, so that one of the output terminals of the selection circuit 211 is selected and one of the input terminals of the selection circuit 212 is selected.

(Operation Before Stop of Power Supply)

The operation in Period 2 in FIG. 6 is described. In Period 2, before supply of power to the storage element 200 is stopped, the control signal S1 is set at the high potential so that the transistors 112 and 226 are turned on. Thus, the potential of the first data held at the node M1 in the storage circuit 101 is input to the gate of the transistor 113 through the transistor 112. The potential input to the gate of the transistor 113 is held by the capacitor 114. In this manner, the potential (VX in FIG. 6) of the second data corresponding to the first data held in the storage circuit 101 is held at the node N1.

Here, given that the high potential is output from the verification circuit 103 as the output signal VERI, when a control circuit (not illustrated) senses the high potential as the output signal VERI during a predetermined period, the control circuit determines that the first data at the node M1 and the second data at the node N2 do not match.

When the control circuit senses that the output signal VERI has the high potential during a predetermined period, the control signals S4 and S5 are set at the high potential. Setting the control signal S4 at the high potential brings the first terminal and the second terminal of the switch 202 into conduction. Thus, the node N4 is set at the high potential. Setting the control signal S4 at the low potential after the potential of the node N4 is kept constant brings the first terminal and the second terminal of the switch 202 out of conduction. With the use of the transistor 222 having the channel formed in an oxide semiconductor for the switch 202, the potential of the node N4 can be maintained for a long time even when the transistor 222 is turned off after the potential of the node N4 is kept constant.

When the node N4 is set at the high potential, the selection circuit 211 selects the other of the output terminals and the selection circuit 212 selects the other of the input terminals. Since the transistor 226 in the storage circuit 203 is on, the potential of the first data held at the node M1 in the storage circuit 101 is input to the gate of the transistor 227 through the transistor 226. The potential input to the gate of the transistor 227 is held by the capacitor 228. In this manner, the potential (VX in FIG. 6) of the second data corresponding to the first data held in the storage circuit 101 is held at the node N5.

When the second data held at the node N5 in the storage circuit 203 has the high potential, to read the second data, the control signal S2 is set at the high potential so that the first terminal and the second terminal of the switch 208 are brought into conduction and the first terminal and the second terminal of the switch 209 are brought out of conduction. Since the node N5 has the high potential, the transistor 227 is turned on, and the first power supply line V1 and the input terminal of the inverter 210 are electrically connected to each other through the transistor 227. Thus, the high potential is output from the output terminal of the inverter 210. The output of the inverter 210 is output through the selection circuit 212, whereby the potential of the node N2 becomes the potential (VX in FIG. 6) of the second data corresponding to the first data held in the storage circuit 101.

When the second data held at the node N5 in the storage circuit 203 has the low potential, to read the second data, the control signal S2 is set at the high potential so that the first terminal and the second terminal of the switch 208 are brought into conduction and the first terminal and the second terminal of the switch 209 are brought out of conduction. Since the node N1 has the low potential, the transistor 227 is turned off, so that the input terminal of the inverter 210 is electrically connected to neither the first power supply line V1 nor the second power supply line V2. Accordingly, the high potential, which has been input to the input terminal of the inverter 106 in the normal operation, is held without change, and the low potential is output from the output terminal of the inverter 210. The output of the inverter 210 is output through the selection circuit 212, whereby the potential of the node N2 becomes the potential of the second data corresponding to the first data held in the storage circuit 101.

The first data and the second data are input to the verification circuit 103. When the control circuit (not illustrated) senses the low potential as the output signal VERI during a predetermined period, the control circuit determines that the first data at the node M1 and the second data at the node N2 match.

When the control circuit determines that the first data and the second data match, the control signal S1 and the control signal S2 are set at the low potential, and writing of the second data into the storage circuit 203 is terminated.

(Operation of Stopping Power Supply)

The operation in Period 3 in FIG. 6 is described. After the operation before stop of supply of power is performed, supply of power to the storage element 200 is stopped at the beginning of Period 3. Here, the power V0 is set at VSS. When supply of power to the storage element 200 is stopped, the first data (dataX) held in the storage circuit 101 is lost. However, in the storage circuit 203, a potential held by the capacitor 228 can be maintained for a long time because the transistor 226 has extremely low off-state current since its channel is formed in an oxide semiconductor. Accordingly, the storage element 200 can hold the second data (VX) in the storage circuit 203 even after supply of power is stopped.

Further, in the storage element 200, a potential held by the node N4 can be maintained for a long time because the transistor 222 that has a channel formed in an oxide semiconductor and thus has extremely low off-state current is used as the switch 202. Accordingly, the storage element 200 can hold the potential at the node N4 even after supply of power is stopped.

(Operation of Restarting Power Supply)

The operation in Period 4 in FIG. 6 is described. Supply of power to the storage element 200 is restarted. Here, the power V0 is set at VDD. Since the control signal S2 has the low potential, there is no conduction between the first terminal and the second terminal of each of the switches 104 and 208 and there is conduction between the first terminal and the second terminal of each of the switches 105 and 209. Thus, the input terminal of the inverter 106 and the second power supply line V2 are electrically connected to each other, and the high potential is input to the input terminal of the inverter 106. Moreover, the input terminal of the inverter 210 and the second power supply line V2 are electrically connected to each other, and the high potential is input to the input terminal of the inverter 210. The potential of the node N4 is the low potential, so that the other of the output terminals of the selection circuit 211 is selected and the other of the input terminals of the selection circuit 212 is selected.

When the second data that has been held at the node N5 in the storage circuit 203 has the high potential, to read the second data, the control signal S2 is set at the high potential so that the first terminal and the second terminal of the switch 208 are brought into conduction and the first terminal and the second terminal of the switch 209 are brought out of conduction. Since the node N5 has the high potential, the transistor 227 is turned on, and the first power supply line V1 and the input terminal of the inverter 210 are electrically connected to each other through the transistor 227. Thus, the high potential is output from the output terminal of the inverter 210. In this manner, the potential of the node N2 becomes the potential (VX in FIG. 6) of the second data held in the storage circuit 203.

When the second data that has been held at the node N5 in the storage circuit 203 has the low potential, to read the second data, the control signal S2 is set at the high potential so that the first terminal and the second terminal of the switch 208 are brought into conduction and the first terminal and the second terminal of the switch 209 are brought out of conduction. Since the node N1 has the low potential, the transistor 227 is turned off, so that the input terminal of the inverter 210 is electrically connected to neither the first power supply line V1 nor the second power supply line V2. Since the input terminal of the inverter 210 has the high potential, the low potential is output from the output terminal of the inverter 210. The output of the inverter 210 is output through the selection circuit 212, whereby the potential of the node N2 becomes the potential of the second data corresponding to the first data held in the storage circuit 101.

At this time, the high potential is input to the selection circuit 111 as the control signal S3, whereby the other of the input terminals of the selection circuit 111 is selected. Accordingly, the other of the input terminals of the selection circuit 111 and the node N2 are electrically connected to each other, and the first data corresponding to the second data is output from the output terminal of the selection circuit 111. In such a manner, the storage circuit 101 can again hold the first data (dataX) which was held before stop of supply of power.

The first data that is held again at the node M1 and the second data that has been held at the node N2 are input to the verification circuit 103. When the control circuit (not illustrated) senses the low potential as the output signal VERI during a predetermined period, the control circuit determines that the first data at the node M1 and the second data at the node N2 match.

When the control circuit determines that the first data and the second data match, the control signal S2 and the control signal S3 are set at the low potential.

Then, in Period 5, the normal operation is resumed.

In the storage element and the driving method thereof in one embodiment of the present invention, even if a defect occurs in the storage circuit 102 and the storage circuit 102 cannot correctly hold the second data, substituting the storage circuit 203 having the same function as the storage circuit 102 for the defective storage circuit 102 allows the second data to be held in the storage circuit 203.

In order for the storage circuit 102 to hold the first data held in the storage circuit 101 as the second data corresponding to the first data, the storage element 200 operates while the potential of the node N4 is kept at the low potential in Periods 1 to 5 in the timing chart of FIG. 6.

When a defect occurs in one of the storage circuits 102 and 203 in the storage element 200 shown in this embodiment, the other storage device can be substituted for the defective storage device. For example, when a defect occurs in the storage circuit 102, the storage circuit 203 can be used in place of the defective storage circuit 102 at once.

In the storage element 200, before supply of power is stopped, data held in the storage circuit 101 is stored to the storage circuit 102, and the data is read from the storage circuit 102 and whether or not the data held in the storage circuit 102 matches the data that has been held in the storage circuit 101 can be determined by the verification circuit 103. When the data are determined not to match each other, the defective storage circuit 102 is replaced by the storage circuit 203 and the data in the storage circuit 101 is stored to the storage circuit 203, and in addition, the data is read from the storage circuit 203 and whether or not the data held in the storage circuit 203 matches the data that has been held in the storage circuit 101 can be determined by the verification circuit 103. After supply of power is restarted, the data in the storage circuit 203 is restored to the storage circuit 101, and whether or not the data held in the storage circuit 203 matches the data returned to the storage circuit 101 can be determined by the verification circuit 103. In such a manner, without additionally requiring a time for verification, the storage element 200 can perform verification at the same time as storage of data from the storage circuit 101 to the storage circuit 203 or restoration of data from the storage circuit 203 to the storage circuit 101.

Configuring a storage device in a signal processing circuit by using one or more of such storage elements 200 can prevent data in the storage device from being lost by stop of supply of power. In addition, after supply of power is restarted, the signal processing circuit can return to the state before stop of supply of power in a short time. Consequently, supply of power to the storage device can be stopped even for a short time, thereby reducing power consumption of the whole signal processing circuit or one or more storage devices configuring the signal processing circuit.

This embodiment can be implemented in combination with any of the other embodiments.

Embodiment 3

In this embodiment, a storage device including a plurality of storage elements shown in any of the foregoing embodiments will be described with reference to FIGS. 7A and 7B.

Figure 7A:
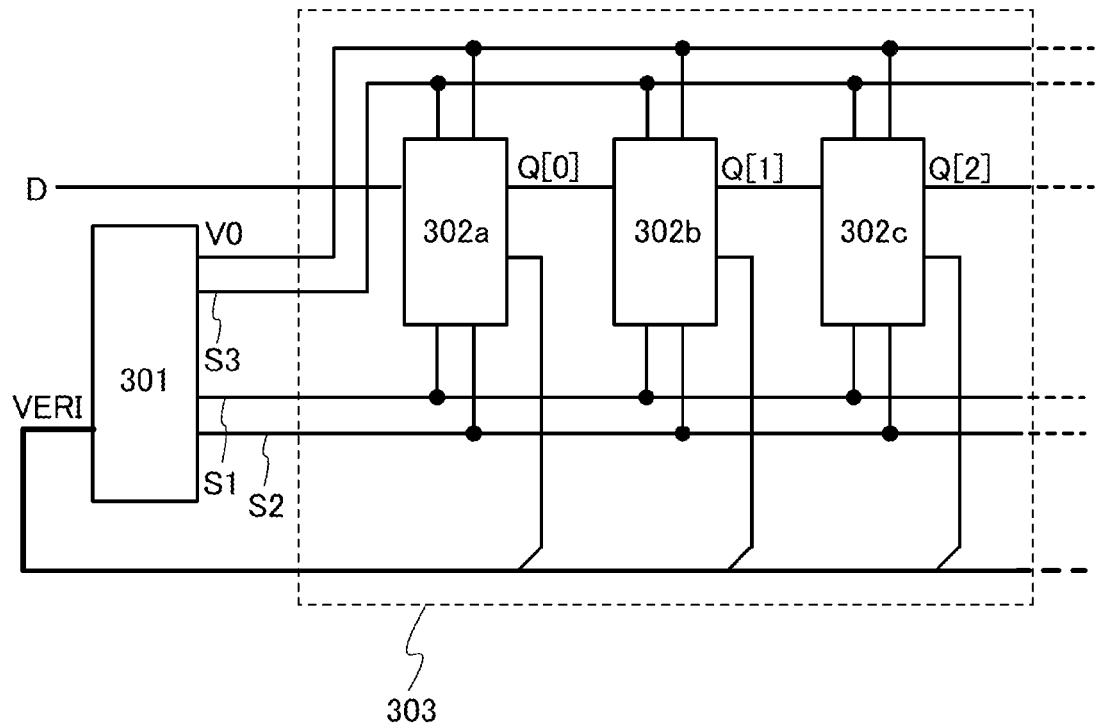
FIGS. 7A and 7B are block diagrams of storage devices.
Figure 7B:
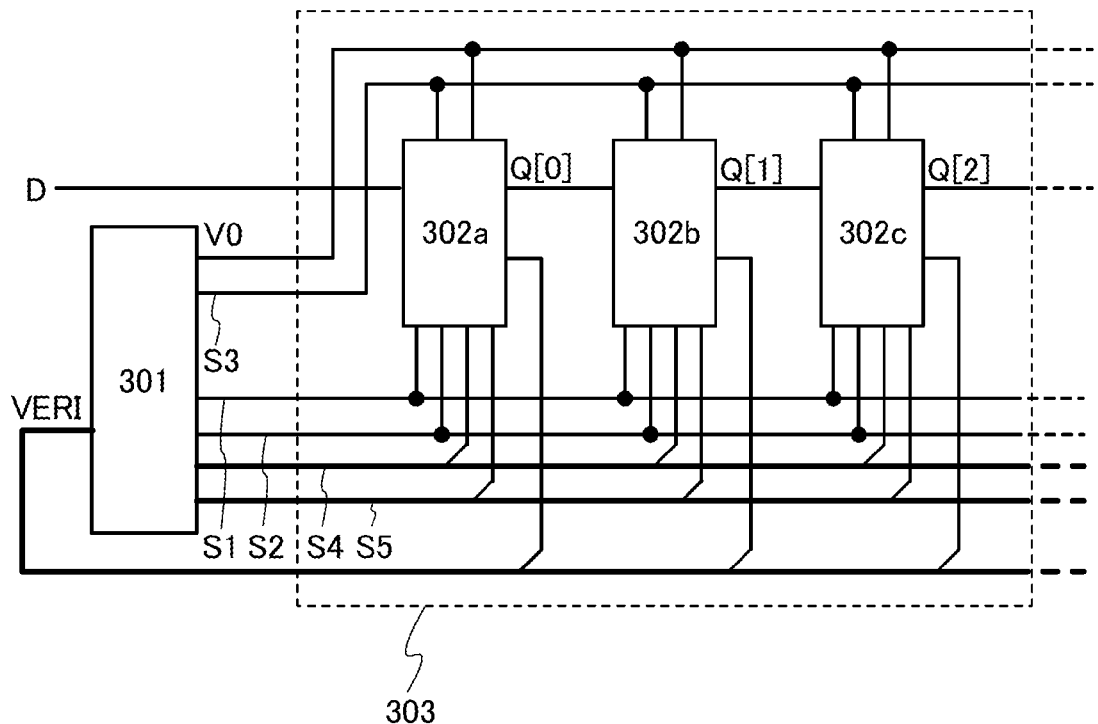

FIGS. 7A and 7B each illustrate one embodiment of a storage device. The storage devices illustrated in FIGS. 7A and 7B each include a control circuit 301 and a storage element group 303 including a plurality of storage elements. FIG. 7A illustrates the case where the storage element 100 shown in Embodiment 1 is used as storage elements 302a to 302c, whereas FIG. 7B illustrates the case where the storage element 200 shown in Embodiment 2 is used as the storage elements 302a to 302c.

In the storage device illustrated in FIG. 7A, the control circuit 301 outputs the power V0, the control signal S1, the control signal S2, and the control signal S3 and supplies them to the storage elements 302a to 302c. The control circuit 301 senses the output signal VERI of a verification circuit in each of the storage elements 302a to 302c, and controls output of the power V0, the control signal S1, the control signal S2, and the control signal S3 in accordance with the output signal VERI and supplies them to the storage elements 302a to 302c.

The data signal D is input to the storage element 302a, and the storage element 302a outputs a data signal Q[0]. The data signal Q[0] is input to the storage element 302b, and the storage element 302b outputs a data signal Q[1]. The data signal Q[1] is input to the storage element 302c, and the storage element 302c outputs a data signal Q[2].

In order to perform the operation before stop of supply of power in the storage device, the control circuit 301 outputs the low potential as the power V0 when sensing that the output signals VERI of the verification circuits in all the storage elements 302a to 302c have the low potential. Thus, supply of power to the storage element group 303 can be stopped.

Even when a time necessary to write data into the second storage circuit varies among the storage elements 302a to 302c, data can be normally written with the control circuit 301 that controls data writing to continue until data writing into the second storage circuits included in all the storage elements 302a to 302c is completed.

In the case where supply of power to the storage device is stopped and then restarted, when the control circuit 301 senses that the output signals VERI of the verification circuits in all the storage elements 302a to 302c have the low potential, the control circuit 301 controls the storage element group 303 to perform the normal operation.

In the storage device illustrated in FIG. 7B, the control circuit 301 outputs the power V0, the control signal S1, the control signal S2, the control signal S3, the control signal S4, and the control signal S5 and supplies them to the storage elements 302a to 302c. The control circuit 301 senses the output signal VERI of a verification circuit in each of the storage elements 302a to 302c, and controls output of the power V0 and the control signals S1 to S5 in accordance with the output signal VERI and supplies them to the storage elements 302a to 302c.

In the case where the storage element 200 is used as the storage elements 302a to 302c, each of the storage elements includes an alternative second storage circuit to be used when a defect occurs in the second storage circuit. For this reason, when the control circuit 301 senses that the output signal VERI of the verification circuit in at least one of the storage elements 302a to 302c is at the high potential during a predetermined period before stop of supply of power, such a storage element is regarded as defective and the defective second storage circuit in the defective storage element can be replaced by the alternative second storage circuit by controlling the control signal S5.

Note that this embodiment shows the case where supply of the power V0 is controlled by the control circuit provided in the storage device; however, the power V0 may be controlled by a control circuit provided outside the storage device.

This embodiment can be implemented in combination with any of the other embodiments.

Embodiment 4

In this embodiment, the structure of a signal processing circuit including the storage elements shown in Embodiment 1 or 2 or the storage device shown in Embodiment 3 will be described with reference to FIG. 8.

Figure 8:
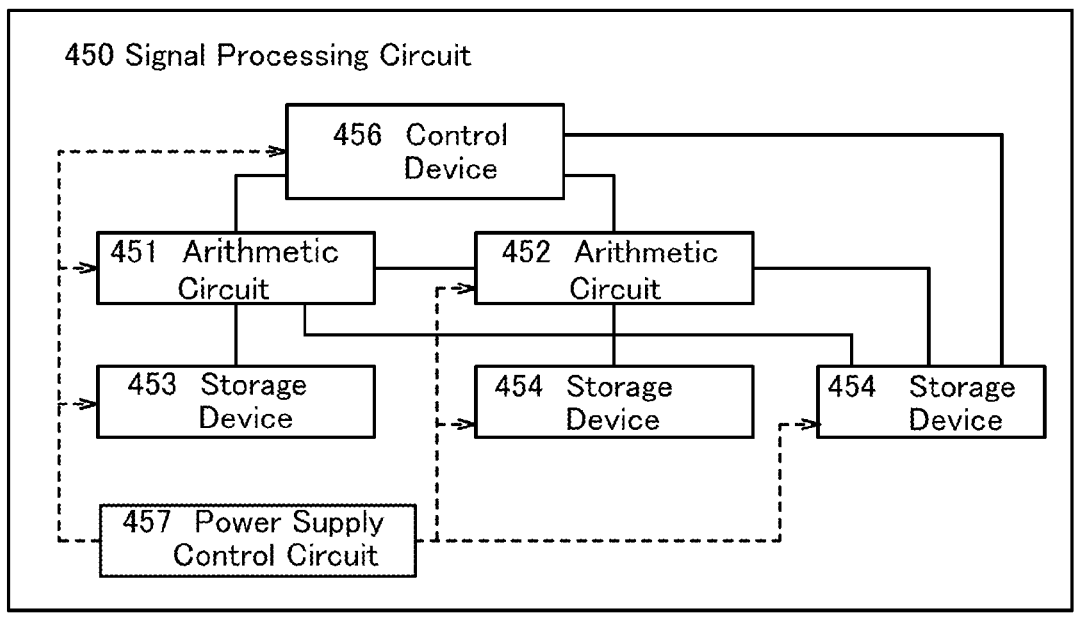
FIG. 8 is a block diagram of a signal processing circuit.

FIG. 8 illustrates an example of a signal processing circuit of one embodiment of the present invention. The signal processing circuit at least includes one or a plurality of arithmetic circuits and one or a plurality of storage devices. Specifically, a signal processing circuit 450 illustrated in FIG. 8 includes an arithmetic circuit 451, an arithmetic circuit 452, a storage device 453, a storage device 454, a storage device 455, a control device 456, and a power supply control circuit 457.

The arithmetic circuits 451 and 452 each include an adder, a multiplier, and various arithmetic circuits as well as a logic circuit that carries out simple logic arithmetic processing. The storage device 453 functions as a register for temporarily holding data when the arithmetic processing is carried out in the arithmetic circuit 451. The storage device 454 functions as a register for temporarily holding data when the arithmetic processing is carried out in the arithmetic circuit 452.

The storage device 455 can be used as main memory, and can store a program executed by the control device 456 as data or can store data from the arithmetic circuits 451 and 452.

The control device 456 collectively controls operations of the arithmetic circuit 451, the arithmetic circuit 452, the storage device 453, the storage device 454, and the storage device 455 included in the signal processing circuit 450. Although FIG. 8 illustrates a structure in which the control device 456 is included in the signal processing circuit 450, the control device 456 may be provided outside the signal processing circuit 450.

With the use of the storage element described in Embodiment 1 or Embodiment 2 or the storage device described in Embodiment 3 for the storage devices 453, 454, and 455, data can be held even when supply of power to the storage devices 453, 454, and 455 is stopped. Thus, supply of power to the entire signal processing circuit 450 is stopped, so that power consumption can be reduced. Alternatively, supply of power to at least one of the storage devices 453, 454, and 455 can be stopped, whereby power consumed by the signal processing circuit 450 can be reduced. In addition, after supply of power is restarted, the signal processing circuit 450 can return to the state before stop of supply of power in a short time.

Supply of power to the control circuit or the arithmetic unit which transmits/receives data to/from the storage device may be stopped in response to the stop of supply of power to the storage device. For example, when the arithmetic circuits 451 and the storage device 453 do not operate, supply of power to the arithmetic circuit 451 and the storage device 453 may be stopped.

The power supply control circuit 457 controls the amount of power supplied to the arithmetic circuit 451, the arithmetic circuit 452, the storage device 453, the storage device 454, the storage device 455, and the control device 456 included in the signal processing circuit 450. Further, a switching element for stopping supply of power may be provided in the power supply control circuit 457, or in each of the arithmetic circuits 451, the arithmetic circuit 452, the storage device 453, the storage device 454, the storage device 455, and the control device 456. In the latter case, the power supply control circuit 457 is not necessarily provided in the signal processing circuit of the present invention.

A storage device functioning as a cache memory may be provided between the storage device 455, which is the main memory, and each of the arithmetic circuit 451, the arithmetic circuit 452, and the control device 456. The cache memory enables reduction of access to low-speed main memory, so that the speed of signal processing such as arithmetic processing can be increased. The use of the above-described storage element also for the storage device functioning as a cache memory can reduce power consumption of the signal processing circuit 450. In addition, after supply of power is restarted, the signal processing circuit 450 can return to the state before the stop of supply of power in a short time.

This embodiment can be implemented in combination with any of the other embodiments.

Embodiment 5

In this embodiment, the configuration of a CPU, which is one of signal processing circuits of one embodiment of the present invention, will be described.

Figure 9:
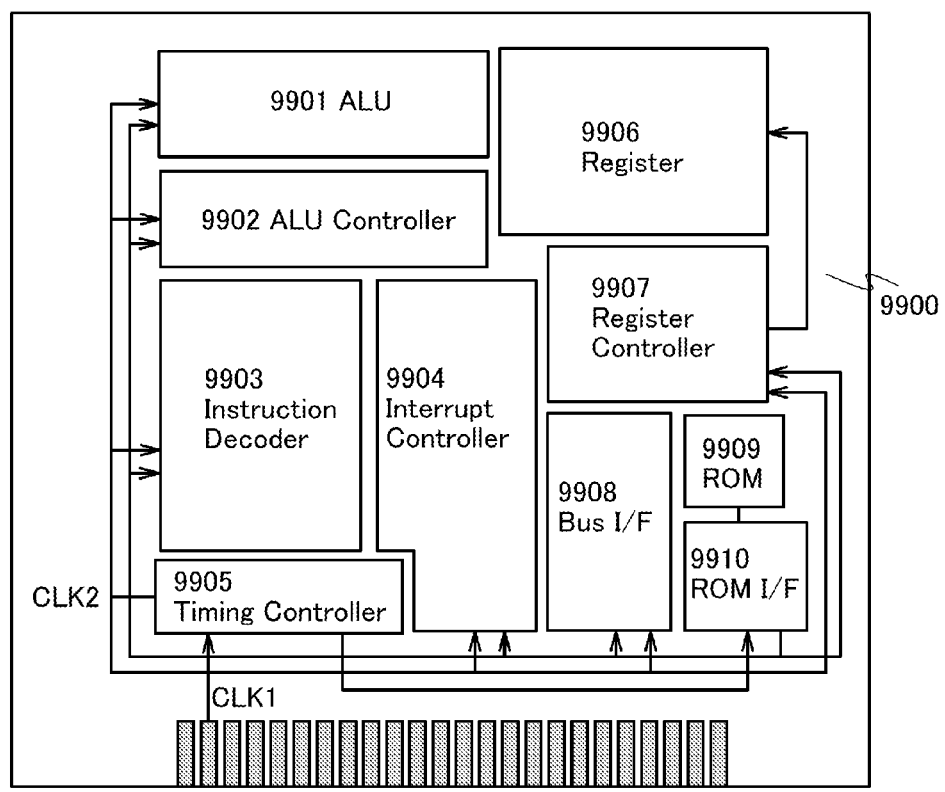
FIG. 9 is a block diagram of a CPU including a storage device.

FIG. 9 illustrates the configuration of the CPU in this embodiment. The CPU illustrated in FIG. 9 mainly includes an ALU 9901, an ALU controller 9902, an instruction decoder 9903, an interrupt controller 9904, a timing controller 9905, a register 9906, a register controller 9907, a bus I/F 9908, a rewritable ROM 9909, and a ROM I/F 9920 over a substrate 9900. Note that ALU is an abbreviation for arithmetic logic unit; bus I/F means bus interface; and ROM I/F means ROM interface. The ROM 9909 and the ROM I/F 9920 may be provided over another chip. Needless to say, the CPU illustrated in FIG. 9 is just an example with a simplified configuration, and an actual CPU has various configurations depending on the application.

An instruction input to the CPU through the bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the operation of the ALU 9901. While the CPU is executing a program, the interrupt controller 9904 processes an interrupt request from an external input/output device or a peripheral circuit on the basis of its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, a storage element having the structure described in any of the above embodiments is provided in the register 9906. In response to an instruction from the ALU 9901, the register controller 9907 determines whether data is held by the storage circuit 101 or the storage circuit 102 (or the storage circuit 203) in the storage element included in the register 9906. When data holding by the storage circuit 102 (or the storage circuit 203) is selected, supply of power to the storage element in the register 9906 can be stopped.

In such a manner, data can be held even when the operation of the CPU is temporarily stopped and supply of power is stopped, so that power consumption can be reduced. Specifically, the operation of the CPU can be stopped while a user of a personal computer does not input data to an input device such as a keyboard, for example, so that power consumption can be reduced.

Although the example of the CPU is described in this embodiment, the signal processing circuit of the present invention is not limited to the CPU and can also be applied to LSIs such as a microprocessor, an image processing circuit, a DSP, and an FPGA.

This embodiment can be implemented in combination with any of the other embodiments.

Embodiment 6

With the use of the signal processing circuit of one embodiment of the present invention, an electronic device with low power consumption can be provided. In particular, when the signal processing circuit with low power consumption in one embodiment of the present invention is added as a component of a portable electronic device which has difficulty in continuously receiving power, the portable electronic device can have a long continuous operation time. Further, with the use of a transistor with low off-state current, redundant circuit design needed to compensate high off-state current is unnecessary; therefore, the integration degree of the signal processing circuit can be increased, and the signal processing circuit can have higher functionality.

The signal processing circuit of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can include the signal processing circuit of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

The description is given of the case where the signal processing circuit of one embodiment of the present invention is applied to portable electronic devices such as a mobile phone, a smartphone, and an e-book reader.

Figure 10:
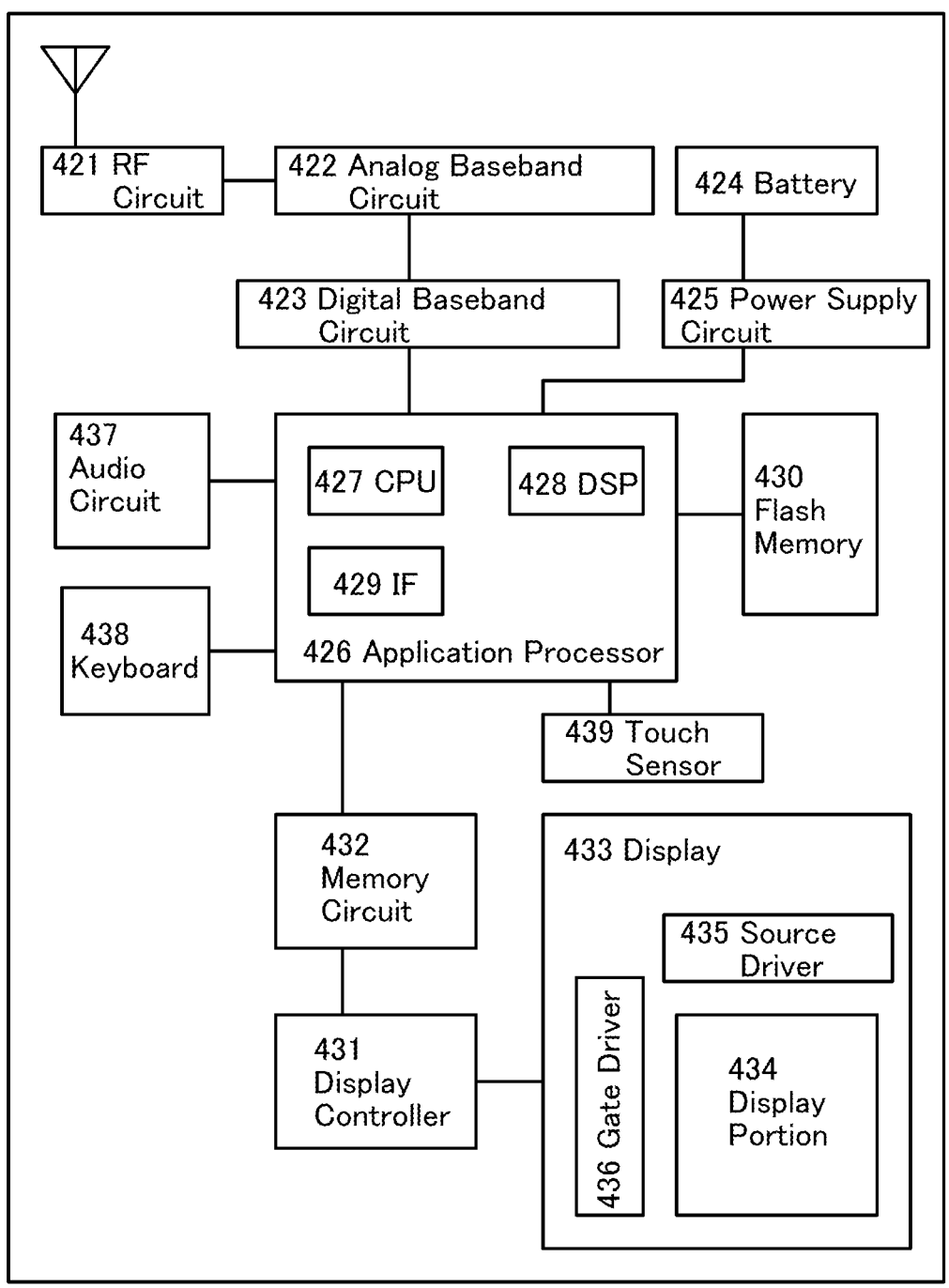
FIG. 10 is a block diagram of a portable electronic device.

FIG. 10 is a block diagram of a portable electronic device. The portable electronic device in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The signal processing circuit described in any of the above embodiments is used for the CPU 427, whereby power consumption can be reduced. The memory circuit 432 is generally composed of SRAM or DRAM; however, the use of the storage device described in any of the above embodiments for the memory circuit 432 can reduce power consumption.

Figure 11:
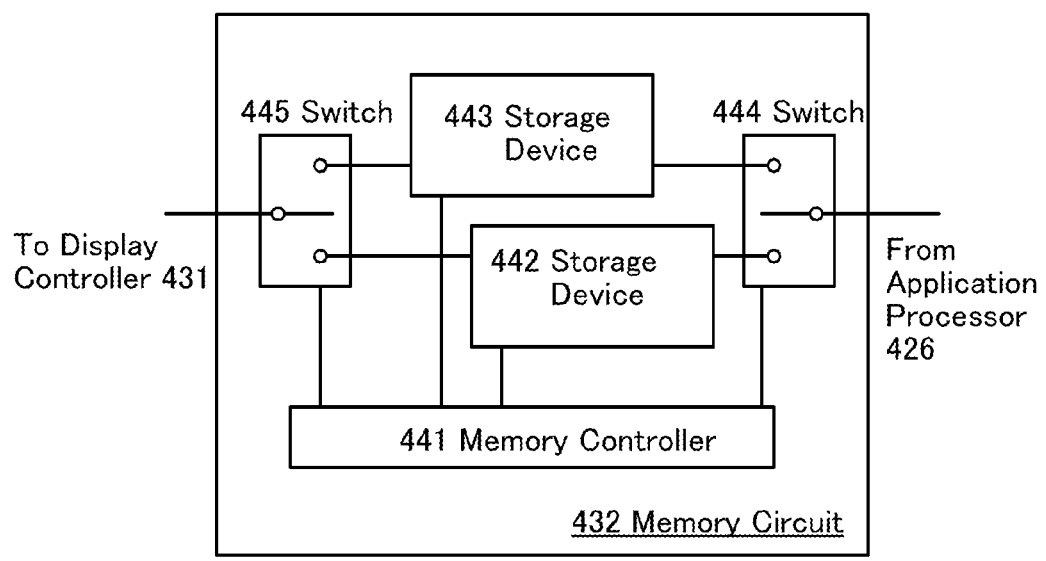
FIG. 11 is a block diagram of a memory circuit.

FIG. 11 is a block diagram of the structure of the memory circuit 432. The memory circuit 432 includes a storage device 442, a storage device 443, a switch 444, a switch 445, and a memory controller 441.

First, image data is received by the portable electronic device or is generated by the application processor 426. The image data is stored in the storage device 442 via the switch 444. Then, the image data output via the switch 444 is sent to the display 433 via the display controller 431. The display 433 displays an image with the use of the image data.

When an image does not change as in the case of a still image, the image data read from the storage device 442 continues to be sent to the display controller 431 via the switch 445, usually at a frequency of 30 Hz to 60 Hz. When a user performs switching of images displayed on the screen, the application processor 426 generates new image data and the image data is stored in the storage device 443 via the switch 444. Image data is periodically read from the storage device 442 via the switch 445 even while the new image data is being stored in the storage device 443.

When the storage of the new image data in the storage device 443 is completed, the new data stored in the storage device 443 is read and sent to the display 433 via the switch 445 and the display controller 431. The display 433 displays an image with the use of the new image data that has been sent.

The reading of the image data is continuously performed until next new image data is stored in the storage device 442. In this manner, the storage device 442 and the storage device 443 alternately perform writing and reading of image data, and the display 433 displays images.

The storage device 442 and the storage device 443 are not necessarily different storage devices, and a memory region included in one storage device may be divided to be used. The use of the storage device described in any of the above embodiments for these storage devices results in the reduction in power consumption.

Figure 12:
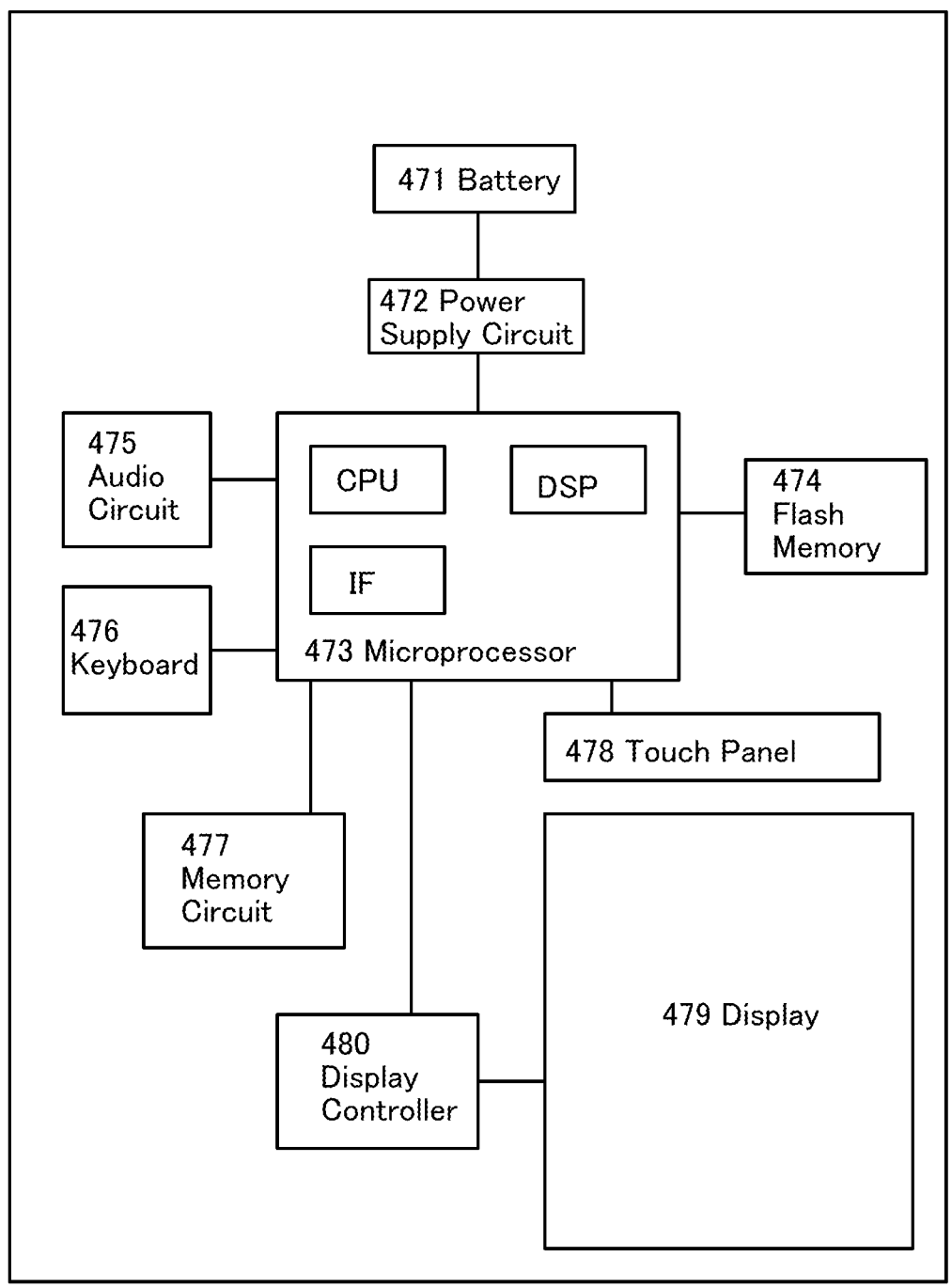
FIG. 12 is a block diagram of an e-book reader.

FIG. 12 is a block diagram of an e-book reader. The e-book reader includes a battery 471, a power supply circuit 472, a microprocessor 473, a flash memory 474, an audio circuit 475, a keyboard 476, a memory circuit 477, a touch panel 478, a display 479, and a display controller 480. The signal processing circuit described in any of the above embodiments is employed for the microprocessor 473, whereby power consumption can be reduced. Further, the storage device described in any of the above embodiments is used for the memory circuit 477, so that power consumption can be reduced.

For example, when a user utilizes a function of highlighting, which clarifies a difference between a predetermined portion and other portions in book data, for example, by changing the color of the display, underlining, displaying with bold letters, or changing the style of letters in the predetermined portion, the data of the portion specified by the user in the book data needs to be stored. The memory circuit 477 has a function of storing such data temporarily. Note that when the data is held for a long time, the data may be copied in the flash memory 474.

This embodiment can be implemented in combination with any of the other embodiments as appropriate.

Embodiment 7

Figure 13:
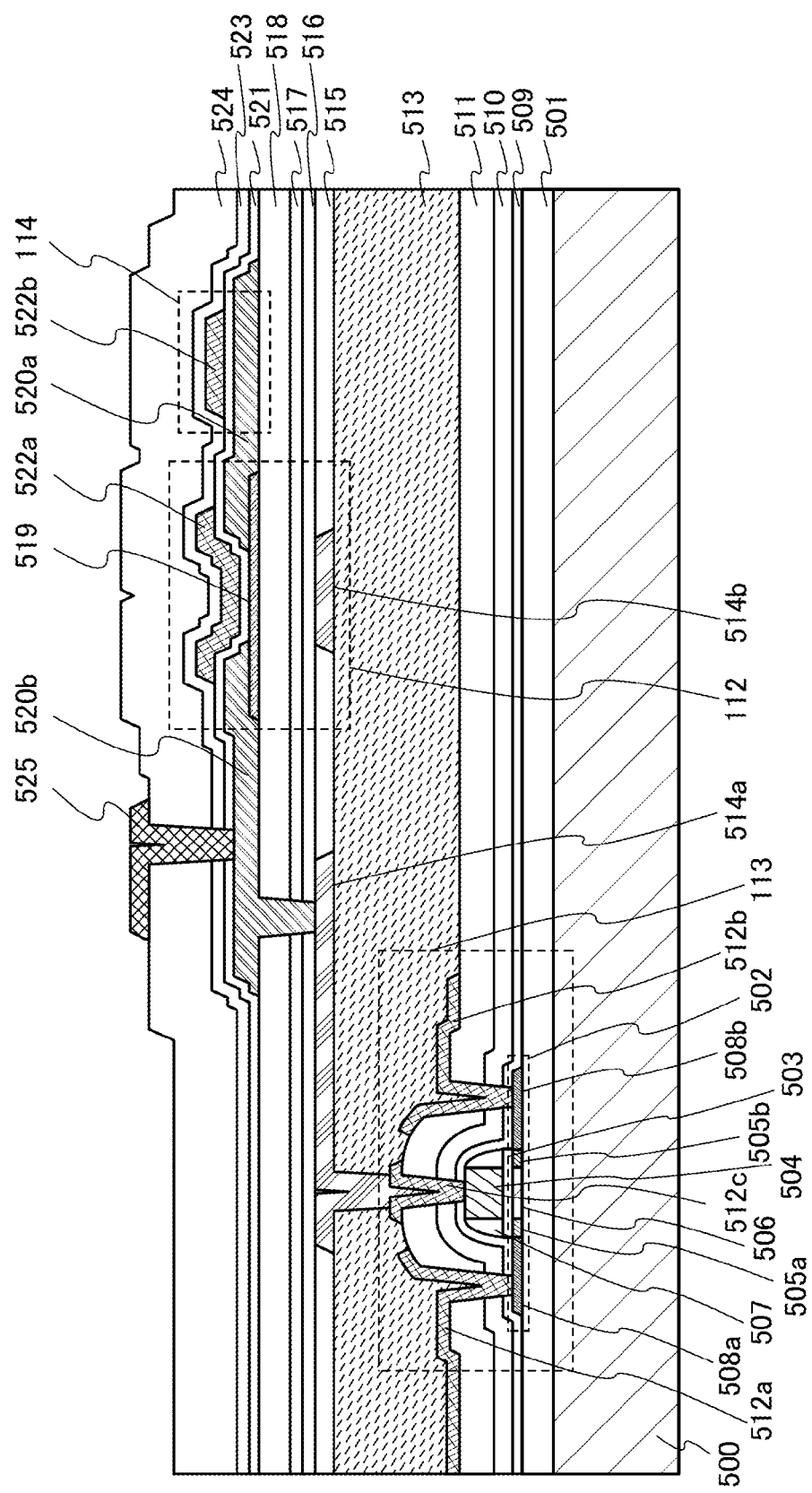
FIG. 13 is a cross-sectional view of a semiconductor device.

In this embodiment, one embodiment of the storage element shown in any of the foregoing embodiments will be described with reference to FIG. 13. FIG. 13 is a cross-sectional view in which the transistor 112 and the capacitor 114 are stacked over the transistor 113 included in the storage element 100 in FIG. 1.

Note that the transistors 112 and 113 are n-channel transistors here; alternatively, one or both of the transistors 112 and 113 may be a p-channel transistor.

First, the transistor 113 formed in the lower part will be described. The transistor 113 is formed over a substrate 500 with an insulating layer 501 placed therebetween.

As the substrate 500, a glass substrate, a ceramic substrate, a quartz substrate, or a sapphire substrate can be used, for example. Alternatively, it is possible to use a single crystal semiconductor substrate or a polycrystalline semiconductor substrate of silicon, silicon carbide, or the like or a compound semiconductor substrate such as a GaAs substrate, an InP substrate, a GaN substrate, a GaP substrate, a GaInAsP substrate, or a ZnSe substrate.

The insulating layer 501 functions as a base insulating film of the transistor 113. The insulating layer 501 is formed using silicon oxide, silicon oxynitride, silicon nitride, silicon nitride oxide, or the like by CVD or sputtering.

In this embodiment, the transistor 113 is formed using a semiconductor layer 502 that is formed over the substrate 500 with the insulating layer 501 placed therebetween; alternatively, the transistor 113 may be formed in the substrate 500.

A flexible substrate may be used as the substrate 500, and the insulating layer 501 and the transistor 113 may be formed over the flexible substrate. Alternatively, a separation layer may be provided between the substrate 500 and the insulating layer 501. Part of or the entire transistor 113 is formed over the separation layer and then the separation layer is separated from the substrate 500, whereby the transistor 113 can be transferred to a substrate with low heat resistance or a flexible substrate.

The semiconductor layer 502 is formed using amorphous silicon, polycrystalline silicon, single crystal silicon, or the like. Amorphous silicon is deposited by CVD, sputtering, or the like. Polycrystalline silicon is obtained by crystallization of amorphous silicon with laser beam irradiation. Single crystal silicon is formed in such a manner that hydrogen ions are implanted into a signal crystal silicon substrate and then a surface portion is separated from the substrate.

The semiconductor layer 502 includes a channel formation region 506, a pair of first impurity regions 505a and 505b provided so that the channel formation region 506 is placed therebetween, and second impurity regions 508a and 508b provided so that the pair of first impurity regions 505a and 505b are placed therebetween. The channel formation region 506 is provided in a region overlapping with a gate electrode layer 504 with the gate insulating layer 503 placed therebetween. The first impurity regions 505a and 505b function as lightly doped drain (LDD) regions. The second impurity regions 508a and 508b function as a source region and a drain region. Note that the impurity concentration of the second impurity regions 508a and 508b is higher than that of the first impurity regions 505a and 505b. In order to fabricate an n-channel transistor, an impurity element imparting n-type conductivity is added to the first impurity regions 505a and 505b and the second impurity regions 508a and 508b. As the impurity element imparting n-type conductivity, phosphorus, arsenic, or the like can be used. In order to fabricate a p-channel transistor, boron, aluminum, gallium, or the like can be used as an impurity element imparting p-type conductivity.

Sidewall insulating layers 507 are provided on side surfaces of the gate electrode layer 504 formed over the gate insulating layer 503. The gate electrode layer 504 and the sidewall insulating layers 507 are used as masks when the impurity element is added to the semiconductor layer 502, whereby the first impurity regions 505a and 505b and the second impurity regions 508a and 508b with different impurity concentrations can be formed in a self-aligned manner.

The gate insulating layer 503 is formed using silicon oxide, silicon oxynitride, silicon nitride, silicon nitride oxide, or the like by CVD or sputtering.

The gate electrode layer 504 is formed using a metal material such as molybdenum, titanium, tantalum, tungsten, aluminum, copper, chromium, neodymium, or scandium or an alloy material containing any of these materials as a main component by sputtering or CVD.

The sidewall insulating layers 507 are formed using silicon oxide, silicon oxynitride, silicon nitride, silicon nitride oxide, or the like by CVD or sputtering.

An insulating layer 509, an insulating layer 510, and an insulating layer 511 are provided to cover the semiconductor layer 502, the gate electrode layer 504, and the sidewall insulating layers 507. Each of the insulating layers 509, 510, and 511 is formed using silicon oxide, silicon nitride oxide, silicon oxynitride, or the like by CVD, sputtering, or the like. Alternatively, it is possible to use silicon oxide formed by low temperature oxidation (LTO) or silicon oxide with favorable step coverage, which is formed by reacting tetraethyl orthosilicate (TEOS), silane, or the like with oxygen, nitrous oxide, or the like.

Openings reaching the second impurity regions 508a and 508b and an opening reaching the gate electrode layer 504 are provided in the insulating layers 509, 510, and 511. Electrode layers 512a, 512b, and 512c are provided in the respective openings. The electrode layers 512a and 512b function as a source electrode layer and a drain electrode layer. The electrode layers 512a to 512c are formed using a metal material such as molybdenum, titanium, tantalum, tungsten, aluminum, copper, chromium, neodymium, or scandium or an alloy material containing any of these materials as a main component by sputtering or PECVD.

An insulating layer 513 is provided over the insulating layer 511 and the electrode layers 512a to 512c. The insulating layer 513 is formed with a material and a method similar to those of the insulating layers 509 to 511. The insulating layer 513 is preferably subjected to polishing treatment (e.g., chemical mechanical polishing (CMP)), dry etching, or plasma treatment to increase the planarity of its surface.

An opening reaching the electrode layer 512c is provided in the insulating layer 513. A wiring layer 514a is formed in the opening. A wiring layer 514b is formed over the insulating layer 513. The wiring layer 514b functions as one of gate electrodes of the transistor 112.

An insulating layer 515 is provided in contact with the wiring layers 514a and 514b. The insulating layer 515 is formed in such a manner that an insulating film is formed over the wiring layers 514a and 514b and then polishing treatment such as CMP, dry etching, or plasma treatment is performed until upper surfaces of the wiring layers 514a and 514b are exposed.

The transistor 113 formed in the lower part and the transistor 112 formed in the upper part are connected to each other through the wiring layer 514a.

An insulating layer 516, an insulating layer 517, and an insulating layer 518 are formed over the wiring layers 514a and 514b and the insulating layer 515. Each of the insulating layers 516 to 518 is formed with a material and a method similar to those of the insulating layers 509 to 511. This embodiment shows the example where three insulating layers are formed over the wiring layers 514a and 514b and the insulating layer 515; however, one or two insulating layers or four or more insulating layers may be provided over the wiring layers 514a and 514b and the insulating layer 515.

An oxide semiconductor layer 519 is provided over the insulating layer 518.

The oxide semiconductor layer 519 preferably contains at least indium (In) or zinc (Zn). As a stabilizer for reducing variation in electric characteristics of a transistor including the oxide semiconductor layer, the oxide semiconductor layer 519 preferably contains one or more of gallium (Ga), tin (Sn), hafnium (Hf), aluminum (Al), and zirconium (Zr).

As another stabilizer, the oxide semiconductor layer 519 may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide; two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component metal oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that an In—Ga—Zn-based oxide, for example, means an oxide containing In, Ga, and Zn, and there is no limitation on the ratio of In, Ga, and Zn. The In—Ga—Zn-based oxide may contain a metal element other than In, Ga, and Zn. The In—Ga—Zn-based oxide has sufficiently high resistance when no electric field is applied thereto, so that the off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or an oxide with an atomic ratio close to the above atomic ratios can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), or In:Sn:Zn=2:1:5 (=$\frac{1}{4}$:$\frac{1}{8}$:$\frac{5}{8}$), or an oxide with an atomic ratio close to the above atomic ratios may be used.

For example, with an In—Sn—Zn-based oxide, high mobility can be obtained relatively easily. However, even with an In—Ga—Zn-based oxide, the mobility can be increased by reduction in the defect density in the bulk.

A structure of an oxide semiconductor film is described below.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the InGaZnO$_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. For example, oxygen vacancies in the oxide semiconductor film might serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including such an oxide semiconductor film rarely has negative threshold voltage (rarely has normally-on characteristics). In addition, the highly purified intrinsic or substantially highly purified intrinsic oxide semiconductor film has few carrier traps; accordingly, the transistor including the oxide semiconductor film has little variation in electrical characteristics and high reliability. Note that charge trapped by carrier traps in an oxide semiconductor film takes a long time to be released, and the trapped charge might behave like fixed charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a TEM image of the microcrystalline oxide semiconductor, crystal parts sometimes cannot be found clearly. In most cases, a crystal part in the microcrystalline oxide semiconductor ranges from 1 nm to 100 nm, or from 1 nm to 10 nm. A microcrystal with a size ranging from 1 nm to 10 nm, or from 1 nm to 3 nm is specifically referred to as nanocrystal (nc). An oxide semiconductor film including nanocrystal is referred to as an nc-OS (nanocrystalline oxide semiconductor) film. For example, in a TEM image of the nc-OS film, a crystal grain cannot be found clearly in some cases.

In the nc-OS film, a microscopic region (e.g., a region with a size ranging from 1 nm to 10 nm, in particular, a region with a size ranging from 1 nm to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a probe diameter larger than that of a crystal part, a peak that shows a crystal plane does not appear. A halo pattern is shown in a selected-area electron diffraction image of the nc-OS film obtained by using an electron beam having a probe diameter (e.g., 50 nm or larger) larger than that of a crystal part. Meanwhile, spots are shown in a nanobeam electron diffraction image of the nc-OS film obtained by using an electron beam having a probe diameter (e.g., ranging from 1 nm to 30 nm) close to or smaller than that of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots are shown in a ring-like region in some cases.

Since the nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In an amorphous oxide semiconductor film, impurities are easily captured and accordingly, the carrier density is likely to increase; thus, relatively high field-effect mobility can be obtained with relative ease.

The crystallinity of an oxide semiconductor film can be increased by deposition of the oxide semiconductor film on a flat surface. For example, the oxide semiconductor film is favorably formed on a surface with an average surface roughness ($R_a$) of 1 nm or less, preferably 0.3 nm or less, more preferably 0.1 nm or less.

Note that $R_a$ is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface. Here, $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Further, $S_0$ represents the area of a rectangle obtained by projecting the specific surface on the xy plane, and $Z_0$ represents the height of the reference surface (the average height of the specific surface). Note that $R_a$ can be measured using an atomic force microscope (AFM).

Thus, planarizing treatment is preferably performed on a region of the insulating layer 518; the oxide semiconductor layer 519 is to be formed in contact with the region. The planarization treatment may be, but not particularly limited to, polishing treatment (e.g. chemical mechanical polishing (CMP)), dry etching treatment, or plasma treatment.

For the deposition of the CAAC-OS film, the following conditions are preferably used.

By reduction in the amount of impurities entering the CAAC-OS film during the deposition, the crystal state can be prevented from being broken by the impurities. For example, the concentration of impurities (e.g., hydrogen, water, carbon dioxide, and nitrogen) existing in a deposition chamber is preferably reduced. Further, the concentration of impurities in a deposition gas is preferably reduced. Specifically, a deposition gas with a dew point of −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition ranges from 100° C. to 740° C., preferably from 200° C. to 500° C. By increasing the substrate heating temperature during the deposition, when a flat-plate-like sputtered particle reaches the substrate, migration occurs on the substrate surface, so that a flat plane of the flat-plate-like sputtered particle is attached to the substrate.

It is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of a sputtering target, a polycrystalline In—Ga—Zn-based oxide target is described below.

The polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the molar ratio of $InO_X$ powder to $GaO_Y$ powder and $ZnO_Z$ powder is, for example, 2:2:1, 8:4:3, 3:1:1, 1:1:1, 4:2:3, or 3:1:2. Note that the kinds of powder and the molar ratio for mixing powder are determined as appropriate depending on the desired sputtering target.

With the use of the CAAC-OS film as the oxide semiconductor layer 519, change in electric characteristics due to irradiation with visible light or ultraviolet light can be reduced in the transistor.

It is preferable that impurities such as hydrogen and water not be contained in the oxide semiconductor layer 519 before, during, and after the deposition. For example, it is preferable that hydrogen, water, and the like included in the insulating layer 518 be removed as much as possible, or that the oxide semiconductor layer 519 be deposited so as to contain hydrogen and water as little as possible. After the deposition of the oxide semiconductor layer 519, heat treatment (also referred to as dehydration or dehydrogenation treatment) may be performed to remove hydrogen, water, and the like that have been included in the oxide semiconductor layer 519. In addition, in order to reduce hydrogen and water to be included in the oxide semiconductor layer 519, an insulating film in contact with the oxide semiconductor layer 519 is also preferably deposited so as to contain hydrogen and water as little as possible. Moreover, dehydration or dehydrogenation treatment may be performed after the deposition of the insulating film.

When a hydrogen impermeable film is used as at least one of the insulating layers 516 and 517, hydrogen contained in the transistor 113 in the lower part, the insulating layer 513, the insulating layer 515, and the like can be prevented from reaching the oxide semiconductor layer 519. As the hydrogen impermeable film, a silicon nitride film, a silicon oxynitride film, an aluminum oxide film, an aluminum oxynitride film, or the like is preferably used. In addition, when a hydrogen impermeable film is used as an insulating layer 523, hydrogen contained in an insulating layer 524 can be prevented from reaching the oxide semiconductor layer 519.

Treatment for supplying oxygen to the oxide semiconductor layer 519 may be performed in order to reduce oxygen vacancies in the oxide semiconductor layer 519. For example, when an insulating film containing an excess amount of oxygen is provided in contact with the oxide semiconductor layer 519 and heat treatment is performed, oxygen can be supplied to the oxide semiconductor layer 519 from the insulating film containing an excess amount of oxygen. By supply of oxygen to the oxide semiconductor layer 519, oxygen vacancies in the oxide semiconductor layer 519 can be reduced. Treatment for adding oxygen to the oxide semiconductor layer 519 may be performed after the oxide semiconductor layer 519 is subjected to dehydration or dehydrogenation treatment. As the treatment for adding oxygen, an oxygen radical, ozone, an oxygen atom, an oxygen ion, or the like is added to the oxide semiconductor layer 519 by ion implantation, ion doping, or plasma treatment, for example. The treatment for adding oxygen may be performed through a gate insulating layer 521.

By reducing impurities serving as electron donors (donors), such as moisture or hydrogen, and reducing oxygen vacancies as described above, a purified oxide semiconductor (purified OS) can be formed. The purified oxide semiconductor is an i-type (intrinsic) semiconductor or a substantially i-type semiconductor; therefore, a transistor including the purified oxide semiconductor having a channel formation region can have significantly low off-state current.

Since impurities such as hydrogen and water and oxygen vacancies have been reduced in the oxide semiconductor layer 519, generation of carriers can be suppressed. Suppressing the increase in carrier density can suppress negative shift of the threshold voltage of the transistor due to the carrier density. As a result, the threshold voltage of the transistor can be easily controlled by a potential applied to the other of the gate electrodes of the transistor. Consequently, the transistor can have high reliability.

A source electrode layer 520a and a drain electrode layer 520b are formed in contact with the oxide semiconductor layer 519. The source electrode layer 520a also functions as one of the electrodes of the capacitor 114. The drain electrode layer 520b is connected to the wiring layer 514a through an opening provided in the insulating layers 516, 517, and 518.

The source electrode layer 520a and the drain electrode layer 520b are formed using a metal material such as molybdenum, titanium, tantalum, tungsten, aluminum, copper, chromium, neodymium, or scandium or an alloy material containing any of these materials as a main component by sputtering or PECVD. Alternatively, the source electrode layer 520a and the drain electrode layer 520b may be formed using a metal nitride material such as tungsten nitride, tantalum nitride, titanium nitride, or molybdenum nitride. Further alternatively, the source electrode layer 520a and the drain electrode layer 520b may be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

In the cross section in the channel length direction, the source electrode layer 520a and the drain electrode layer 520b each have projected lower end portions. Such shapes can be formed in such a manner that a conductive film is formed over the insulating layer 518 and the oxide semiconductor layer 519 and then subjected to etching plural times. The source electrode layer 520a and the drain electrode layer 520b having such shapes can be adequately covered with the gate insulating layer 521 formed later.

The gate insulating layer 521 is formed over the oxide semiconductor layer 519, the source electrode layer 520a, and the drain electrode layer 520b.

The gate insulating layer 521 is formed using silicon oxide, gallium oxide, aluminum oxide, aluminum oxynitride, silicon oxynitride, silicon nitride oxide, silicon nitride, or the like by sputtering, MBE, PECVD, pulse laser deposition, or ALD. When the gate insulating layer 521 is formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, gate leakage current can be reduced. The gate insulating layer 521 is formed with a single-layer structure or a stacked structure using any of the above materials.

A gate electrode layer 522a is formed in a region overlapping the oxide semiconductor layer 519. An electrode layer 522b is formed in a region overlapping the source electrode layer 520a. The gate electrode layer 522a functions as the other of the gate electrodes. The electrode layer 522b functions as the other of the electrodes of the capacitor 114.

The gate electrode layer 522a and the electrode layer 522b are formed using a metal material such as molybdenum, titanium, tantalum, tungsten, aluminum, copper, chromium, neodymium, or scandium or an alloy material containing any of these materials as a main component by sputtering or PECVD. Alternatively, the gate electrode layer 522a and the electrode layer 522b may be formed using a metal nitride material such as tungsten nitride, tantalum nitride, titanium nitride, or molybdenum nitride. Further alternatively, the gate electrode layer 522a and the electrode layer 522b may be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

The insulating layer 523 and the insulating layer 524 are formed over the gate electrode layer 522a and the electrode layer 522b. Each of the insulating layers 523 and 524 is formed with a material and a method similar to those of the insulating layers 509 to 511. As described above, a film impermeable to hydrogen, water, or the like may be used as at least one of the insulating layers 523 and 524.

An opening reaching the drain electrode layer 520b is provided in the insulating layers 523 and 524, and a wiring layer 525 is provided in the opening. The wiring layer 525 is formed with a material and a method similar to those of the wiring layers 514a and 514b.

An insulating film and/or a wiring may be additionally provided over the insulating layer 524 and the wiring layer 525.

Note that in the layer where the transistor 113 is formed, the transistors constituting the switches 104 and 105, the storage circuit 101, and the verification circuit 103 illustrated in FIG. 1 are formed in addition to the transistor 113.

In order to form the storage element 200 shown in Embodiment 2, the transistor 226 and the capacitor 228 included in the storage circuit 203 can be formed in the layer where the transistor 112 and the capacitor 114 are formed in the storage element illustrated in FIG. 13, or can be formed over the layer where the transistor 112 and the capacitor 114 are formed (e.g., the insulating layer 524 and the wiring layer 525). The transistor using an oxide semiconductor can be stacked over another element more easily than a transistor using silicon. Moreover, the transistor using an oxide semiconductor can achieve a stack of at least three layers more easily than a magnetic element and a ferroelectric element. For these reasons, the transistor 226 and the capacitor 228 can be formed over the layer where the transistor 112 and the capacitor 114 are formed, and another transistor 226 and another capacitor 228 can be formed thereover; therefore, the area of the storage element 200 can be reduced.

This embodiment can be implemented in combination with any of the other embodiments as appropriate.

This application is based on Japanese Patent Application serial No. 2012-147187 filed with Japan Patent Office on Jun. 29, 2012, the entire contents of which are hereby incorporated by reference.

What is claimed is:

1. A signal processing circuit comprising:
a first storage circuit;
a second storage circuit;
a verification circuit;
a first switch;
a second switch;
an inverter;
a first power supply line having a low potential; and
a second power supply line having a high potential,
wherein:
the first storage circuit holds first data only in a period during which power is supplied, and outputs a data signal,
the second storage circuit holds second data corresponding to the first data in accordance with a first control signal,
the first switch and the second switch electrically connect the first power supply line and an input terminal of the inverter through the second storage circuit or electrically connect the second power supply line and the input terminal of the inverter, in accordance with a second control signal,
the inverter outputs the second data held in the second storage circuit, from an output terminal, and
the verification circuit determines whether the first data and the second data match or not, and supply of the power to the first storage circuit is stopped when the verification circuit determines that the first data and the second data match.

2. The signal processing circuit according to claim 1, wherein:
when supply of the power to the first storage circuit is restarted,
the first switch and the second switch electrically connect the first power supply line and the input terminal of the inverter through the second storage circuit or electrically connect the second power supply line and the input terminal of the inverter, in accordance with the second control signal,
the second data held in the second storage circuit is output from the output terminal of the inverter,
the second data is held again in the first storage circuit as the first data, and
the verification circuit determines whether the first data and the second data match or not.

3. The signal processing circuit according to claim 1, wherein the verification circuit comprises a selection circuit and an inverter.

4. The signal processing circuit according to claim 1, wherein:
the second storage circuit comprises a first transistor, a second transistor, and a capacitor, and
a channel formation region of the first transistor comprises an oxide semiconductor material.

5. The signal processing circuit according to claim 1, wherein:
the first switch comprises one conductivity type transistor, and
the second switch comprises another conductivity type transistor.

* * * * *